(12) United States Patent
Sakakibara et al.

(10) Patent No.: US 8,853,004 B2
(45) Date of Patent: Oct. 7, 2014

(54) METHOD OF MANUFACTURING SEMICONDUCTOR DEVICE

(71) Applicant: Renesas Electronics Corporation, Kanagawa (JP)

(72) Inventors: Junji Sakakibara, Itami (JP); Takehiko Ikegami, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/784,238

(22) Filed: Mar. 4, 2013

(65) Prior Publication Data

US 2013/0237014 A1 Sep. 12, 2013

(30) Foreign Application Priority Data

Mar. 9, 2012 (JP) ................................ 2012-052583

(51) Int. Cl.
*H01L 21/56* (2006.01)
*H01L 23/00* (2006.01)

(52) U.S. Cl.
CPC .............. *H01L 21/56* (2013.01); *H01L 2224/97* (2013.01); *H01L 2224/45144* (2013.01); *H01L 2224/48247* (2013.01); *H01L 24/97* (2013.01); *H01L 21/561* (2013.01); *H01L 2924/01322* (2013.01); *H01L 21/565* (2013.01)
USPC ........................................................ 438/112

(58) Field of Classification Search
None
See application file for complete search history.

(56) References Cited

FOREIGN PATENT DOCUMENTS

| JP | 07-241888 A | 9/1995 |
|---|---|---|
| JP | 2000-195881 A | 7/2000 |
| JP | 2008-118012 A | 5/2008 |

*Primary Examiner* — Seahvosh Nikmanesh
(74) *Attorney, Agent, or Firm* — Mattingly & Malur, PC

(57) ABSTRACT

Disclosed is a technique in which an excessive resin can be stably cut and removed in a molding step. In a step for separating part of a runner leading to a resin-sealing body from the resin-sealing body, the runner is formed by a first runner and a second runner coupled to the first runner and the resin-sealing body. The runner is separated from a middle of the second runner by supporting, with a first supporting portion, the second runner from the side of the second surface of a lead frame, and by pushing down, with a break pin, the first runner in the direction from the side of the first surface of the lead frame toward the side of the second surface thereof, while the resin-sealing body is in a condition of floating in the air.

16 Claims, 34 Drawing Sheets

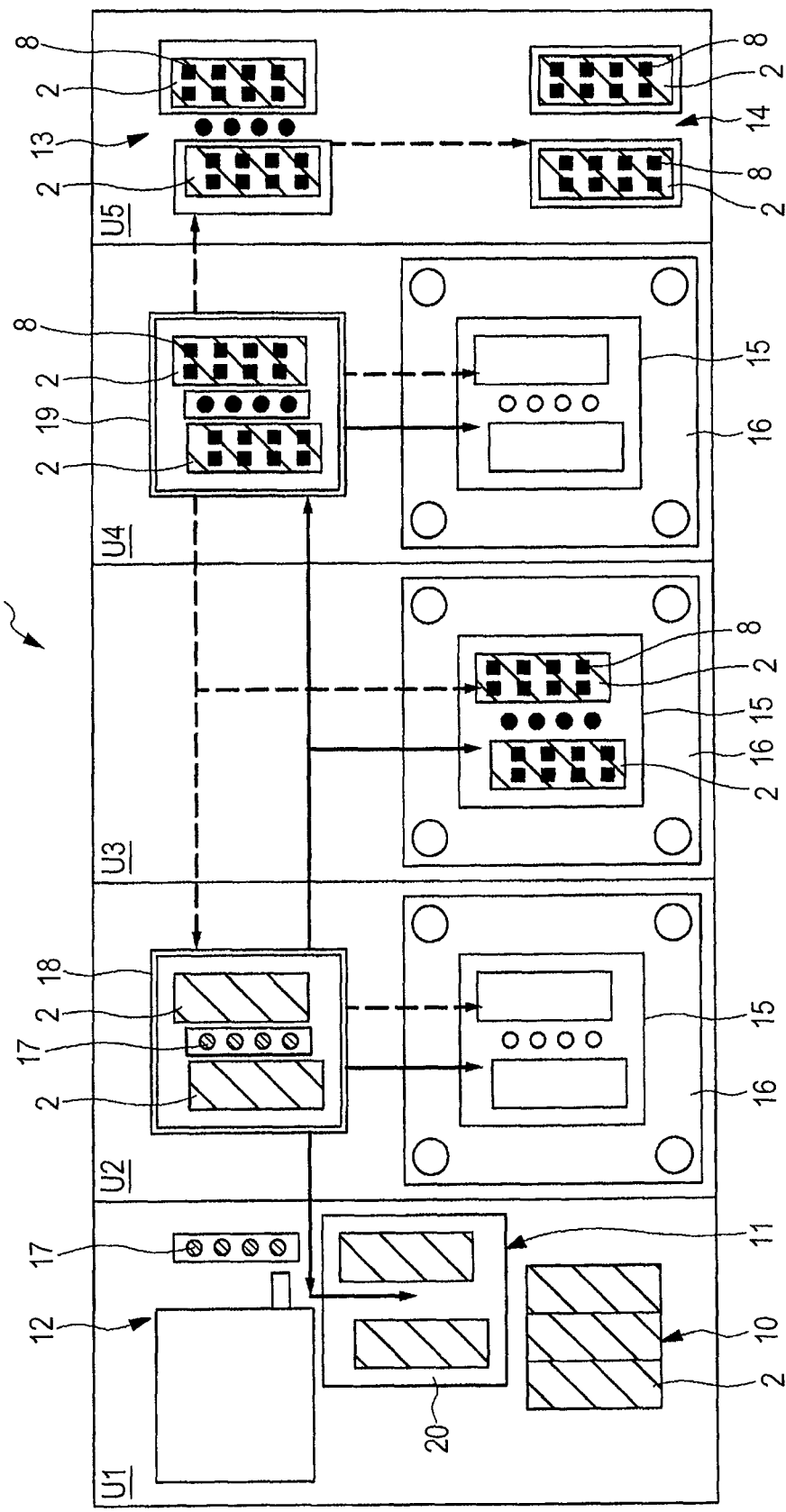

FIG. 7A
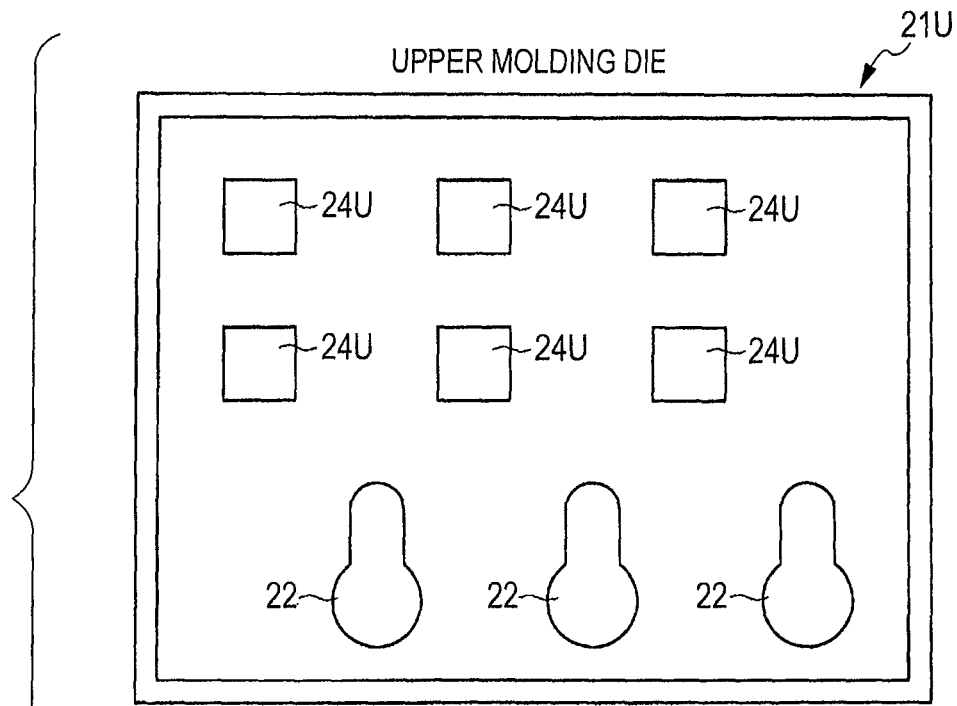
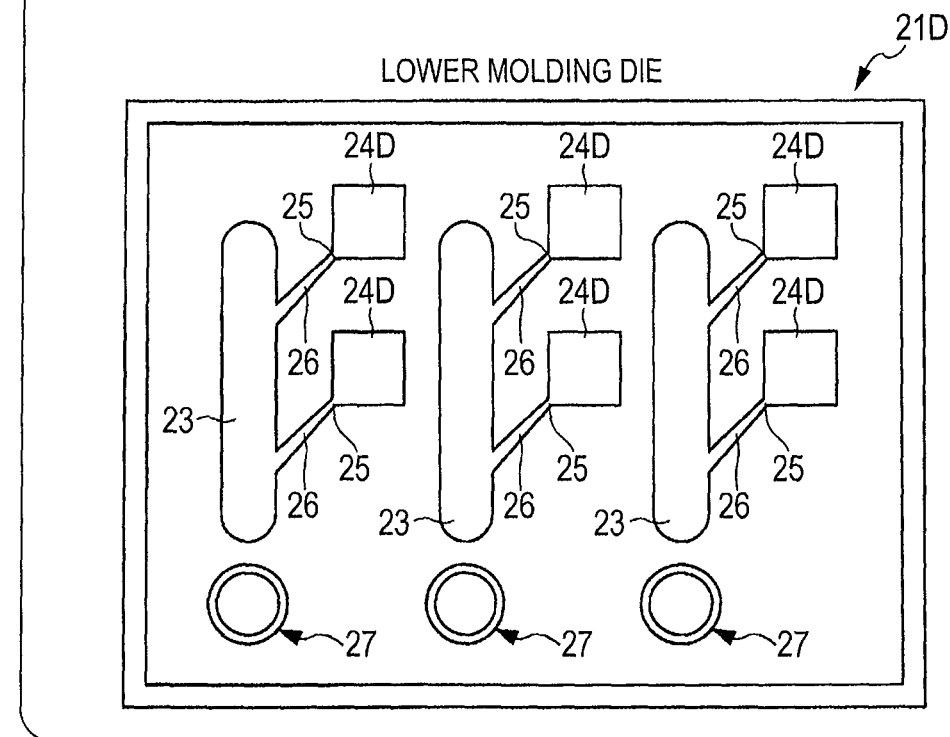

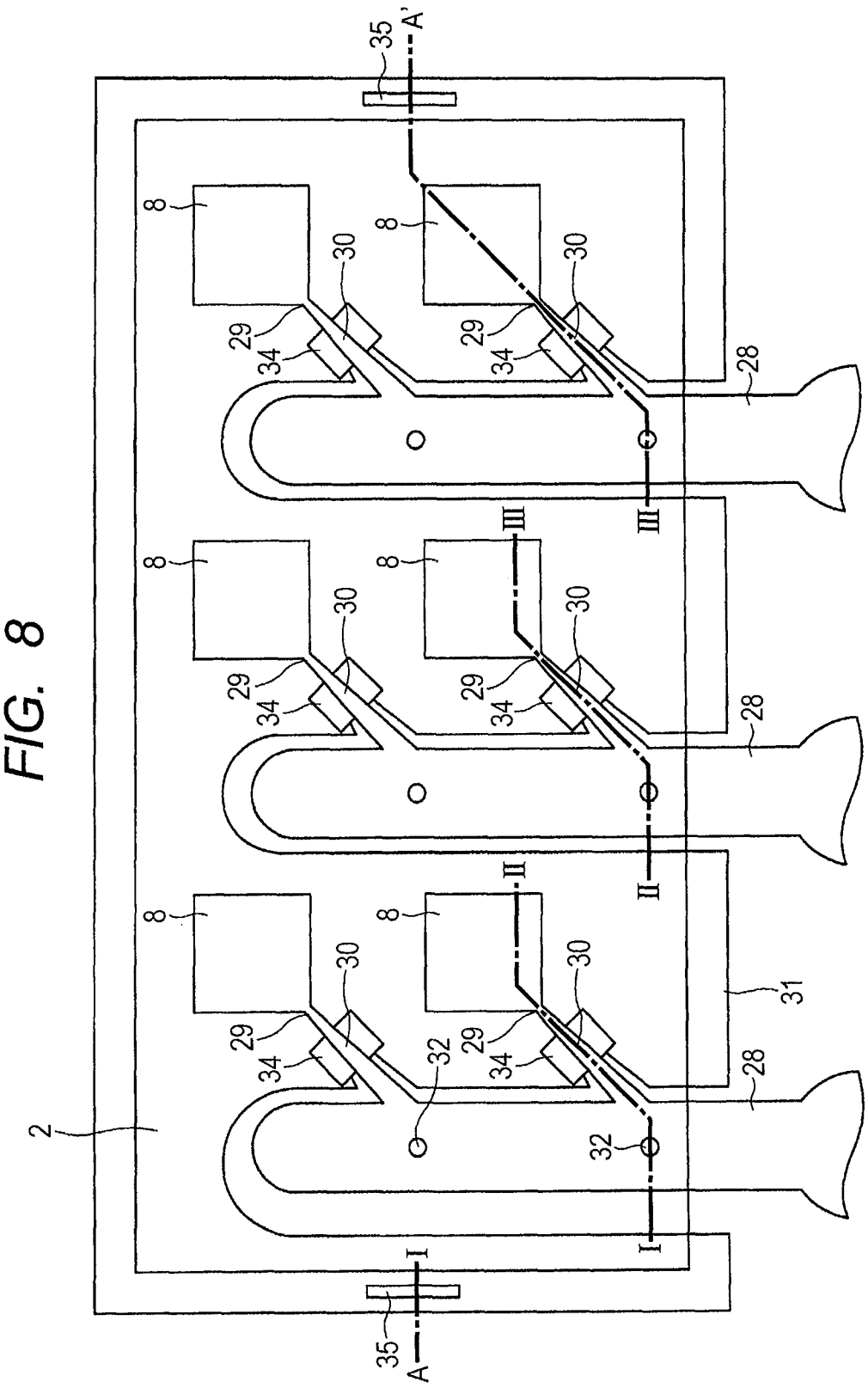

FIG. 18
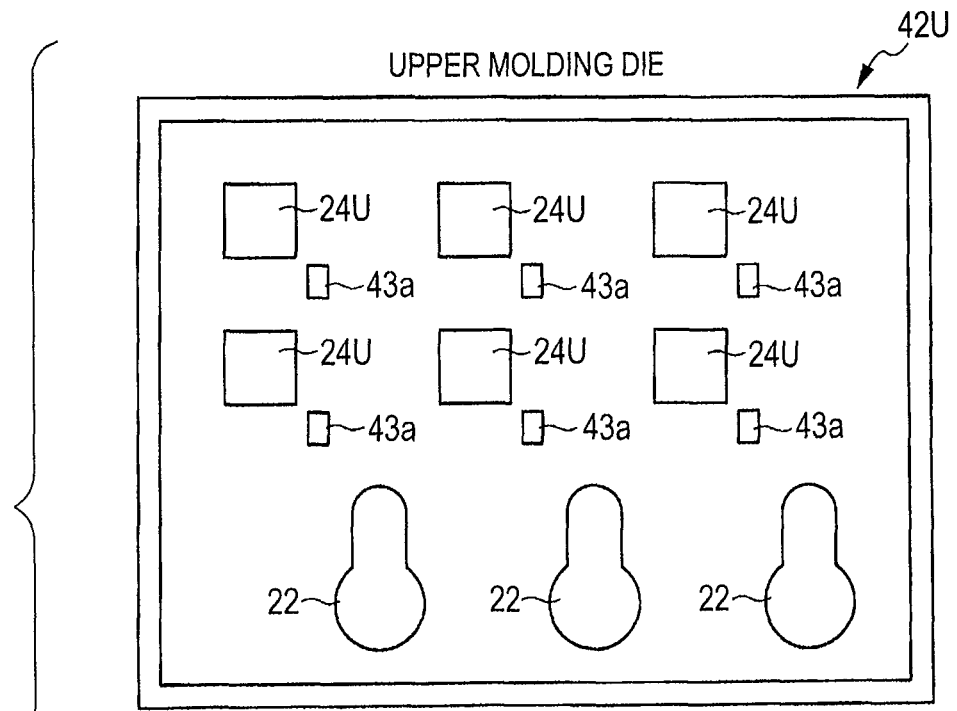
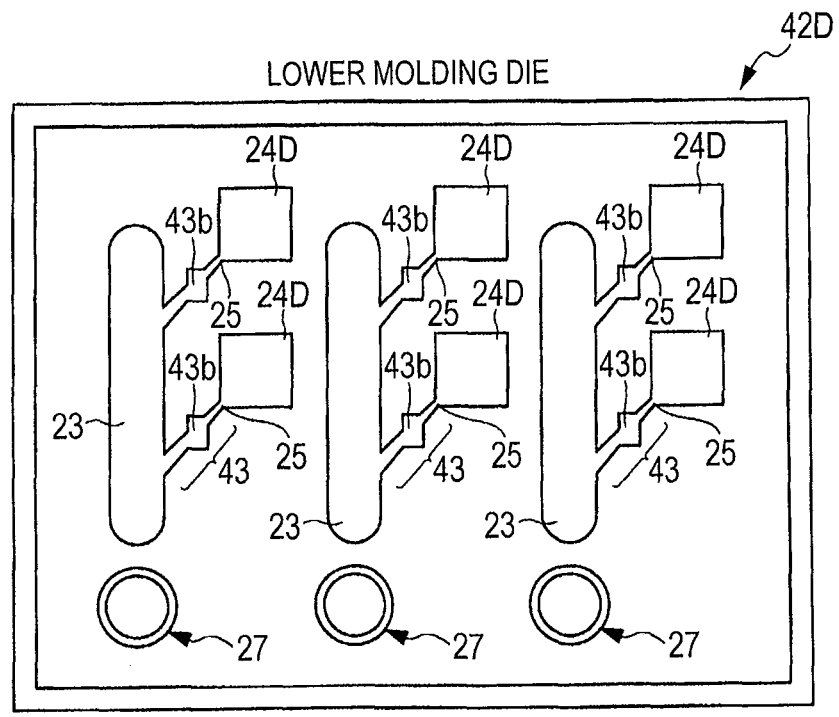

FIG. 22
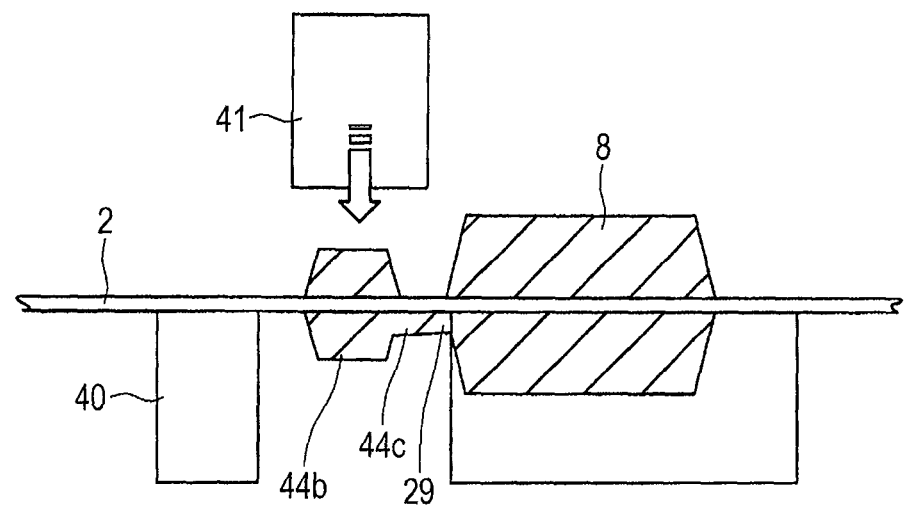
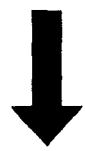
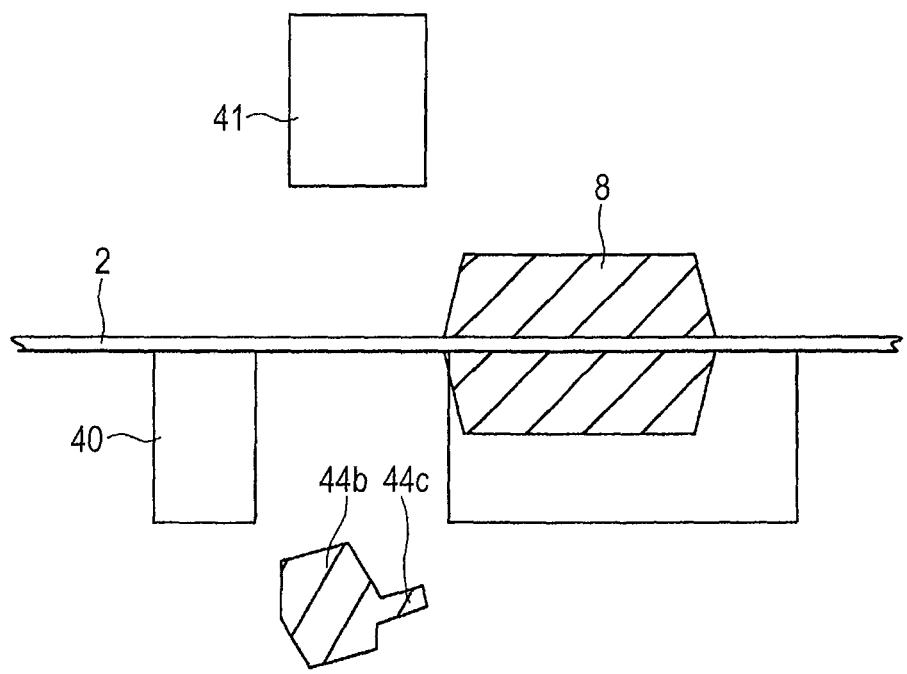

METHOD OF MANUFACTURING SEMICONDUCTOR DEVICE

CROSS-REFERENCE TO RELATED APPLICATIONS

The disclosure of Japanese Patent Application No. 2012-052583 filed on Mar. 9, 2012 including the specification, drawings and abstract is incorporated herein by reference in its entirety.

BACKGROUND

The present invention relates to a method of manufacturing a semiconductor device, and in particular, to a technique that is effective when applied to a process of resin-sealing a semiconductor device by a transfer mold process.

For example, a technique is disclosed in Japanese Unexamined Patent Publication No. 2000-195881, in which: before a pin presses a runner portion, a boundary portion pressing unit having a convex shape, which is provided at the center of the upper surface of a breaking plate, presses an area near to the boundary between a gate portion and a mold portion from the side of the second major surface of a lead frame in order to deform the lead frame near to the boundary toward the gate portion side, thereby breaking the gate portion from the lead frame.

In addition, in Japanese Unexamined Patent Publication No. Hei 07 (1995)-241888, a technique is disclosed, in which: in a gate breaking process, before a gate runner resin linked to one side surface of a resin-sealing body is removed, the resin-sealing body is bent with respect to the gate runner resin, thereby creating a crack between the one side surface of the resin-sealing body and the gate runner resin.

In addition, in Japanese Unexamined Patent Publication No. 2008-118012, a technique is disclosed, in which: stress concentration is prompted by supporting a molded cull in a state of being inclined with respect to the horizontal direction of a pressed substrate, thereby allowing a crack to be generated in the boundary between a package portion and a molded gate portion, and a molded runner gate is then separated from a molded article by twisting it.

SUMMARY

Although bromine included in the flame retardant in a mold resin (melt resin, resin member) to be used in a resin-sealing body for sealing a semiconductor chip or to be used in a wiring board over which a semiconductor chip is mounted, is not included in the RoHS (Restriction of Hazardous Substances) Directive, it is said that it can affect the environment. Accordingly, halogen-free resins, not including bromine, chlorine, and antimony, etc., are recently used in mold resins for forming resin-sealing bodies or wiring boards, from the viewpoint of environmental protection and reduction in environmentally harmful substances.

Specifically, collection and recovery of wastes of electrical and electronic equipment are regulated, and further plastics including brominated flame retardants are regulated, by the WEEE (Waste Electrical and Electronic Equipment) Directive, as substances to be removed from the wastes separately collected. The halogen-free resin to be used in a mold resin for forming a resin-sealing body means a material having a chlorine content of 0.09% by weight or less, a bromine content of 0.09% by weight or less, and an antimony content of 0.09% by weight or less. The halogen-free resin to be used in a mold resin for forming a wiring board means a material having a chlorine content of 0.09% by weight or less and a bromine content of 0.09% by weight or less, and the total weight of chlorine and bromine of 0.15% by weight or less. That is, when a halogen-free resin is used in a mold resin for forming a resin-sealing body or a wiring board, the material regulated by the WEEE Directive is used.

If bromine is removed from a mold resin, the fire retardancy of a resin-sealing body is deteriorated. Accordingly, a resin having high fire retardancy is to be used in a main material for a resin-sealing body. However, in a resin having high fire retardancy, Tg thereof generally becomes low (decrease in glass transition temperature) and the molecular weight thereof generally becomes low. The viscosity of a resin whose molecular weight has become low is low, and hence so-called "wetting" becomes good to a metal, such as a lead frame. Therefore, such a resin has an essential quality that adhesion strength becomes large as well as due to the adhesiveness originally held by the resin.

However, if the adhesion strength between a resin and a lead frame is large, various technical problems are caused as described below. That is, in a molding step, part of an excessive resin sometimes remains over a lead frame, when gate breaking in which an excessive resin is removed from the lead frame over which a resin-sealing body is formed is performed. Accordingly, after the aforementioned gate breaking, the residual resin is removed by using a cutting punch (cutting tooth). At the time, however, a failure is sometimes caused, in which, because part of the residual resin is sandwiched between a die (holder for a molding die) and the lead frame, the die is damaged, a cut position is shifted, a flaw is caused over the surface of a semiconductor product, or the like.

An object of the present invention is to provide a technique in which an excessive resin can be stably cut and removed in a molding step.

The aforementioned and other objects and new features of the present invention will become clear with reference to the description and accompanying drawings of the present specification.

Of the inventions disclosed in this application, one embodiment according to a typical invention will be briefly described as follows.

This embodiment is a method of manufacturing a semiconductor device, including the steps of: mounting a semiconductor chip over a first surface of a lead frame; electrically coupling an electrode pad formed over the major surface of the semiconductor chip and a lead in the lead frame; resin-sealing the semiconductor chip with a resin-sealing body; and separating part of a runner leading to the resin-sealing body from the resin-sealing body. The runner is comprised of a first runner and a second runner whose one side is coupled to the first runner and the other side is coupled to the resin-sealing body. The step of separating part of the runner leading to the resin-sealing body from the resin-sealing body further includes the following steps of: mounting the lead frame over a table in such a way that: one surface of the lead frame over which the runner is formed is oriented downward and the other surface, opposite to the one surface, is oriented upward, and part of the second runner is supported from the one surface side by the first supporting portion; and separating the runner from the middle of the second runner by pushing down, with a break pin, the first runner in the direction from the other surface side toward the one surface side while the resin-sealing body is in a condition of floating in the air.

Of the inventions disclosed in the present application, an effect acquired by one embodiment according to a typical invention will be briefly described as follows.

An excessive resin can be stably cut and removed in a molding step.

BRIEF DESCRIPTION OF THE DRAWINGS

FIG. 6 is a schematic view explaining an example of the structure of a molding apparatus according to First Embodiment of the invention;

FIG. 7A are plan views of essential parts, illustrating examples of a lower molding die and an upper molding die of a molding die included in the molding apparatus according to First Embodiment of the invention, respectively;

FIG. 8 is a top view of essential parts illustrating a gate break portion before gate breaking, explaining an example of a gate breaking process according to First Embodiment of the invention;

FIG. 18 are plan views of essential parts, illustrating examples of a lower molding die and an upper molding die of a molding die included in a molding apparatus according to Second Embodiment of the invention, respectively;

FIG. 22 is a sectional view of essential parts explaining an example of a residual resin removing process in a residual gate removing step according to Second Embodiment of the invention;

DETAILED DESCRIPTION

Figure 1:
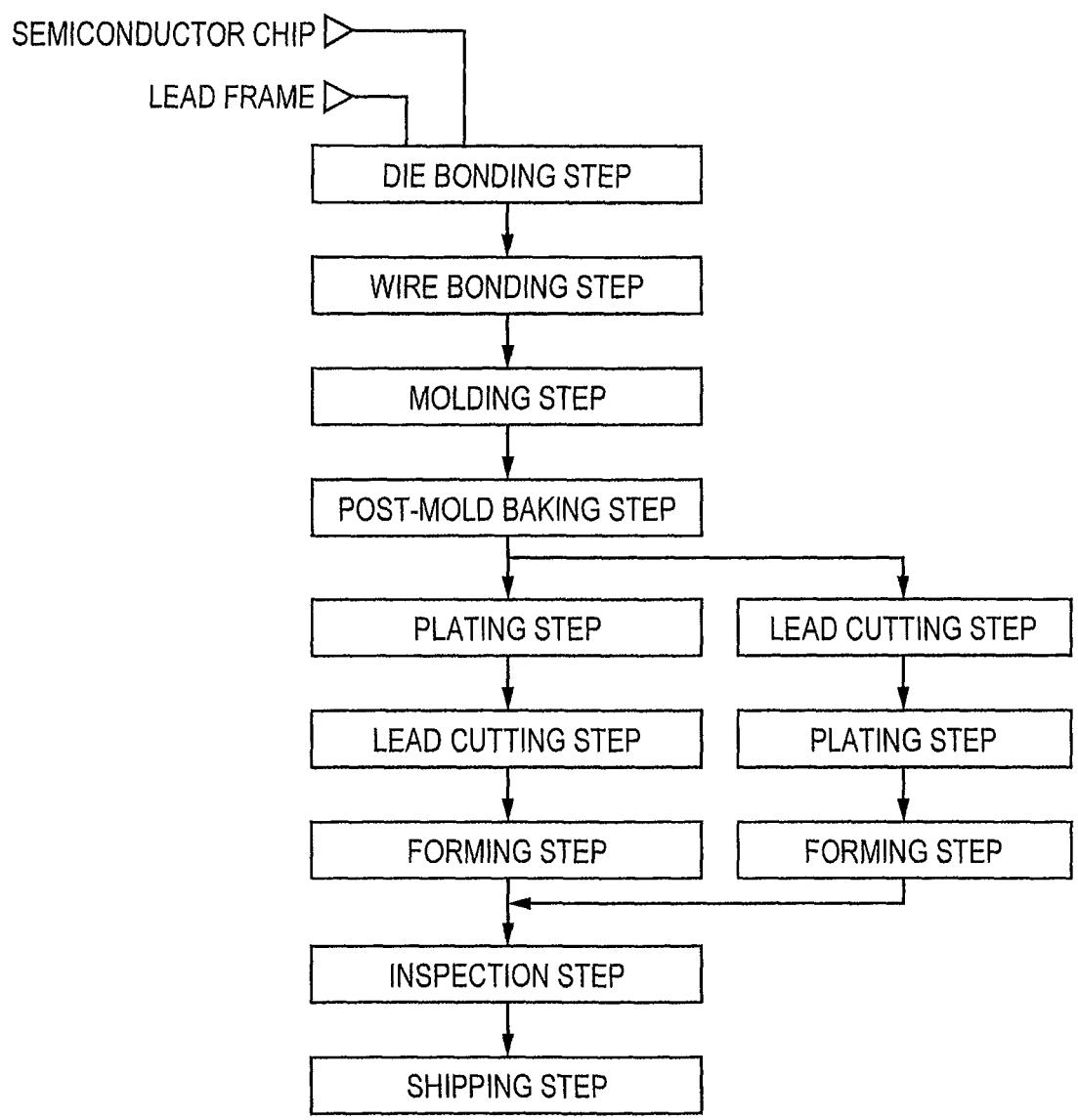
FIG. 1 is a view illustrating the steps in a method of manufacturing a semiconductor device according to First Embodiment of the present invention.

In the following embodiments, when necessary for convenience, description is given by dividing the embodiment into a plurality of sections or embodiments, however, unless explicitly stated, they are not independent of one another, but one is related with the other part or the whole as a modification example, a detail, supplementary description, etc. In addition, in the following embodiments, when referred to the number of elements, etc. (number of units, numerical value, quantity, range, etc., are included), unless stated explicitly or except when the number is obviously limited to specific numbers in principle, the number is not limited to the specific ones but may be more or less than the specific numbers. Further, in the following embodiments, it is needless to say that components (constituent steps, etc., are also included) are not necessarily requisite unless stated explicitly or except when they are obviously requisite in principle. Similarly, in the following embodiments, when shapes, positions, relations, etc., of components, etc., are referred to, unless stated explicitly or except when they can be thought otherwise in principle, those substantially the same or similar to the shapes, etc., are also included. This applies to the aforementioned numerical values and ranges.

In the drawings used in the embodiments, hatching may be added even to plan views in order to make them easier to see.

In addition, like components are denoted with like reference numerals in principle in each of the views for explaining the embodiments, and duplicative explanations are omitted. Hereinafter, preferred embodiments of the present invention will de described in detail based on the accompanying drawings.

(Conventional Gate Breaking Process Studied by Present Inventors)

Figure 29:
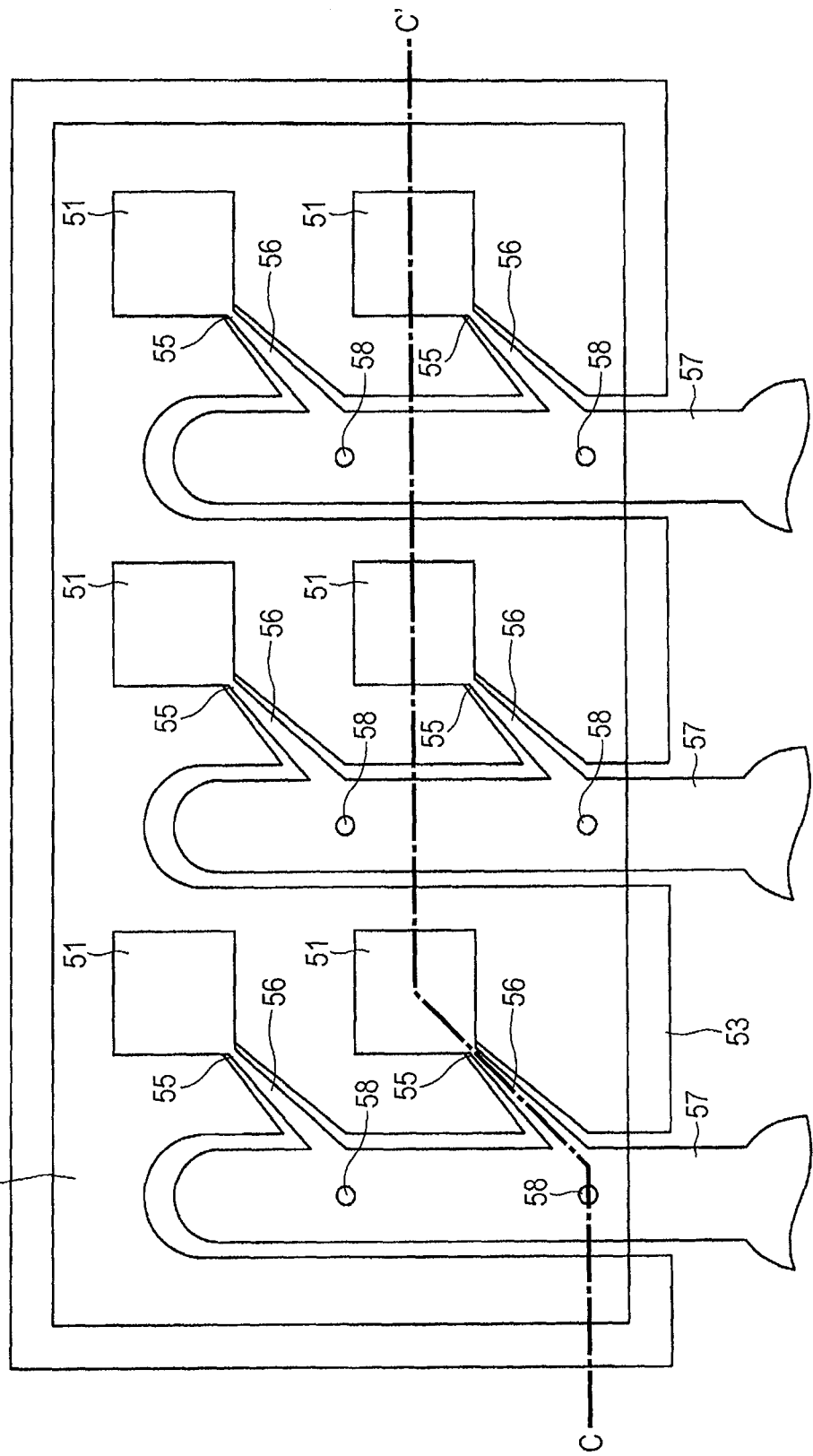
FIG. 29 is a top view of essential parts illustrating a gate break portion before gate breaking, explaining an example of a gate breaking process studied by the present inventors.
Figure 30:
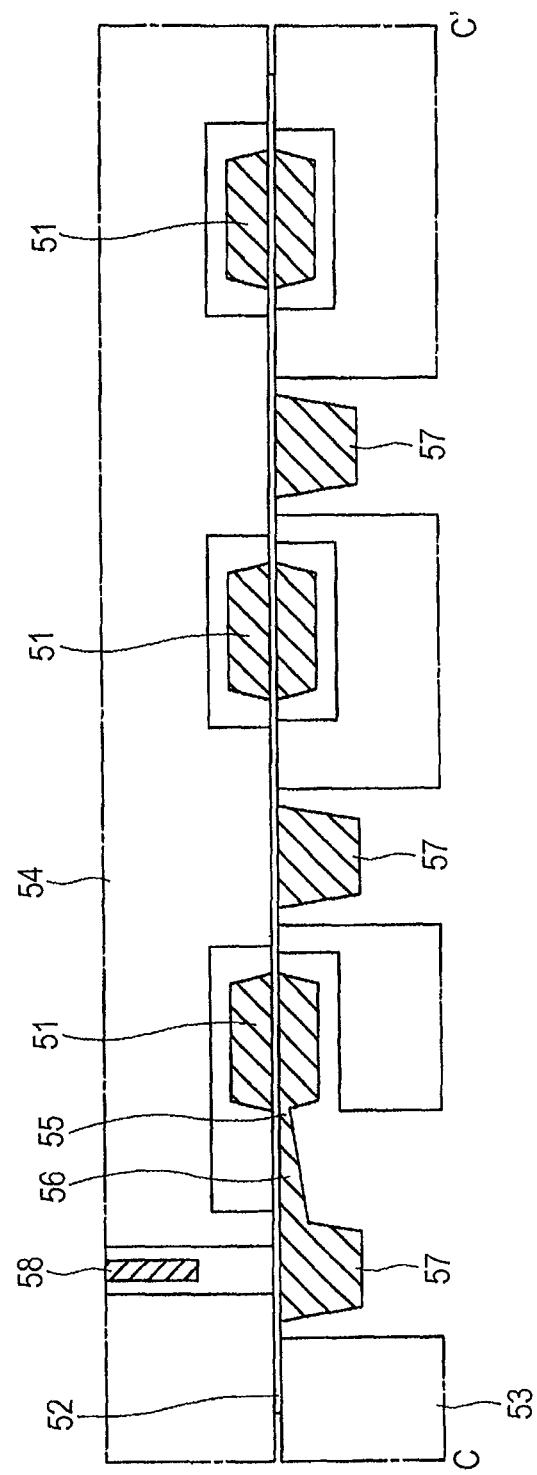
FIG. 30 is a sectional view of essential parts, taken along C-C' Line in FIG. 29.
Figure 31:
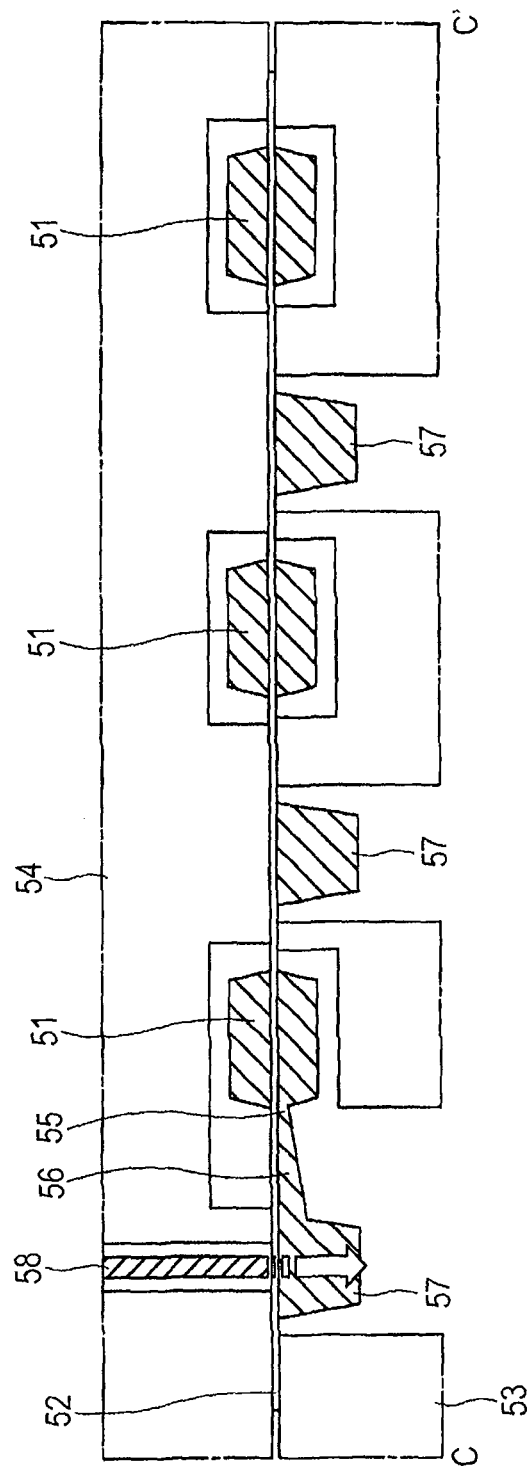
FIG. 31 is a sectional view of essential parts illustrating the gate break portion during the gate breaking, explaining an example of the gate breaking process studied by the inventors.
Figure 32:
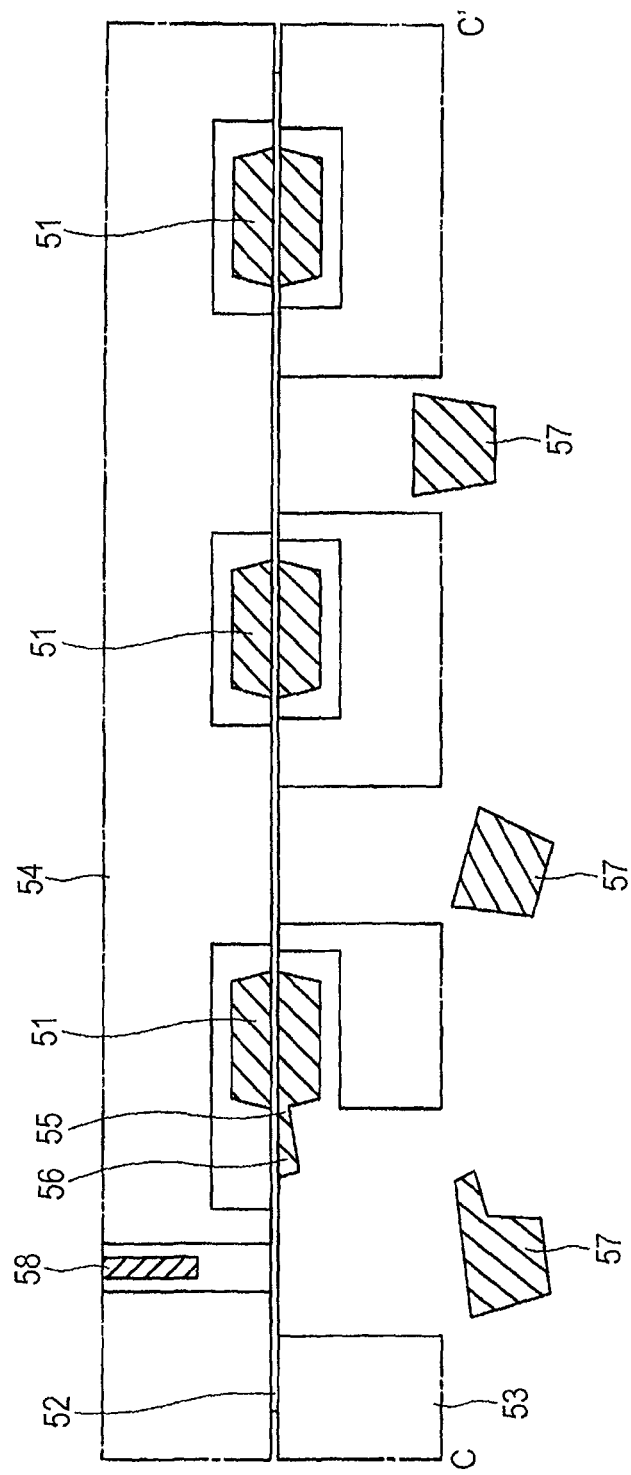
FIG. 32 is a sectional view of essential parts illustrating the gate break portion after the gate breaking, explaining an example of the gate breaking process studied by the inventors.
Figure 33:
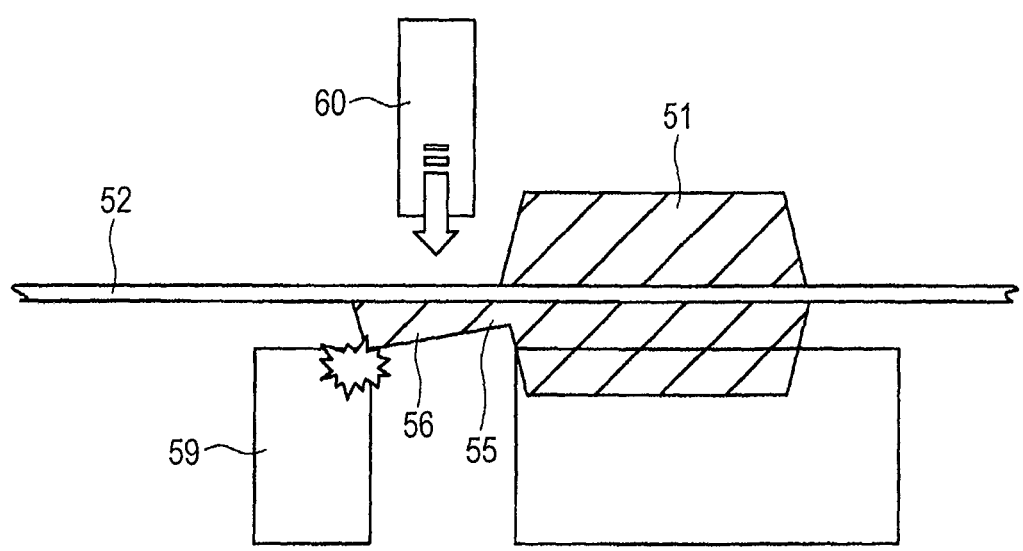
FIG. 33 is a sectional view of essential parts, explaining a situation of a die damage caused in the residual gate removing step when the gate breaking process studied by the inventors is adopted.

A related-art gate breaking process in the molding step studied by the present inventors will be first described. FIG. 29 is a top view of essential parts illustrating a gate break portion before gate breaking, explaining an example of a gate breaking process, FIG. 30 is a sectional view of essential parts, taken along C-C' Line in FIG. 29, FIG. 31 is a sectional view of essential parts illustrating the gate break portion during the gate breaking, explaining an example of the gate breaking process, and FIG. 32 is a sectional view of essential parts illustrating the gate break portion after the gate breaking, explaining an example of the gate breaking process. In addition, FIG. 33 is a sectional view of essential parts, explaining a situation of a die damage caused in the residual gate removing step. In FIG. 29, the upper molding die of a molding die is omitted and a top view of essential parts is illustrated by seeing through a lead frame.

As illustrated in FIGS. 29 and 30, a lead frame 52 over which a sealing resin, such as a resin-sealing body 51, is formed is mounted over a table 53 in a gate break portion in a molding apparatus. At the time, a first surface of the lead frame 52 over which a semiconductor chip is mounted is oriented upward such that the lead frame 52 is sandwiched and fixed by the table 53 and a clamper 54. The semiconductor chip is protected by the resin-sealing body 51 formed of both the sealing resin formed over the first surface of the lead frame 52 and that formed over a second surface thereof. In addition, over the second surface of the lead frame 52, a gate 55, a second runner (sub-runner) 56, and a first runner 57, which are formed with a mold resin flowing when resin-sealing is performed, are formed sequentially and continuously from the resin-sealing body 51. The resin-sealing body 51 is located in the space formed by a concave portion formed in the table 53 and that formed in the clamper 54, and is in a condition of floating in the air.

Subsequently, as illustrated in FIG. 31, a break pin 58 is inserted down, in the direction from the side of the first surface of the lead frame 52 toward the side of the second surface thereof, from a hole formed in the lead frame 52. With the break pin 58 being inserted down, the first runner 57 is pressed.

Further, as illustrated in FIG. 32, the middle of the second runner 56 is broken by pushing down the first runner 57 with the break pin 58, thereby allowing the first runner 57 to be separated from the middle of the second runner 57. However, even when the first runner 57 is pressed by the break pin 58, a bent is not created in the lead frame 52 located between the first runner 57 and the resin-sealing body 51, and hence part of the second runner 56 and the gate 55 are likely to remain, and the breaks occur at various positions.

Accordingly, as illustrated in FIG. 33, the gate 55 and the part of the second runner 56 (residual resin), which remain without being separated from the resin-sealing body 51, are sometimes sandwiched between the lead frame 52 and a die (holder of a molding die) 59 in the subsequent residual gate removing step. If a cutting punch 60 is brought down, in this condition, from the side of the first surface of the lead frame 52, the residual resin is sandwiched between the lead frame 52 and the die 59, thereby possibly causing a failure in which the die 59 is damaged, a cut position is shifted, a flaw is caused over the surface of a semiconductor product (resin-sealing body 51), or the like.

(First Embodiment)

Figure 2:
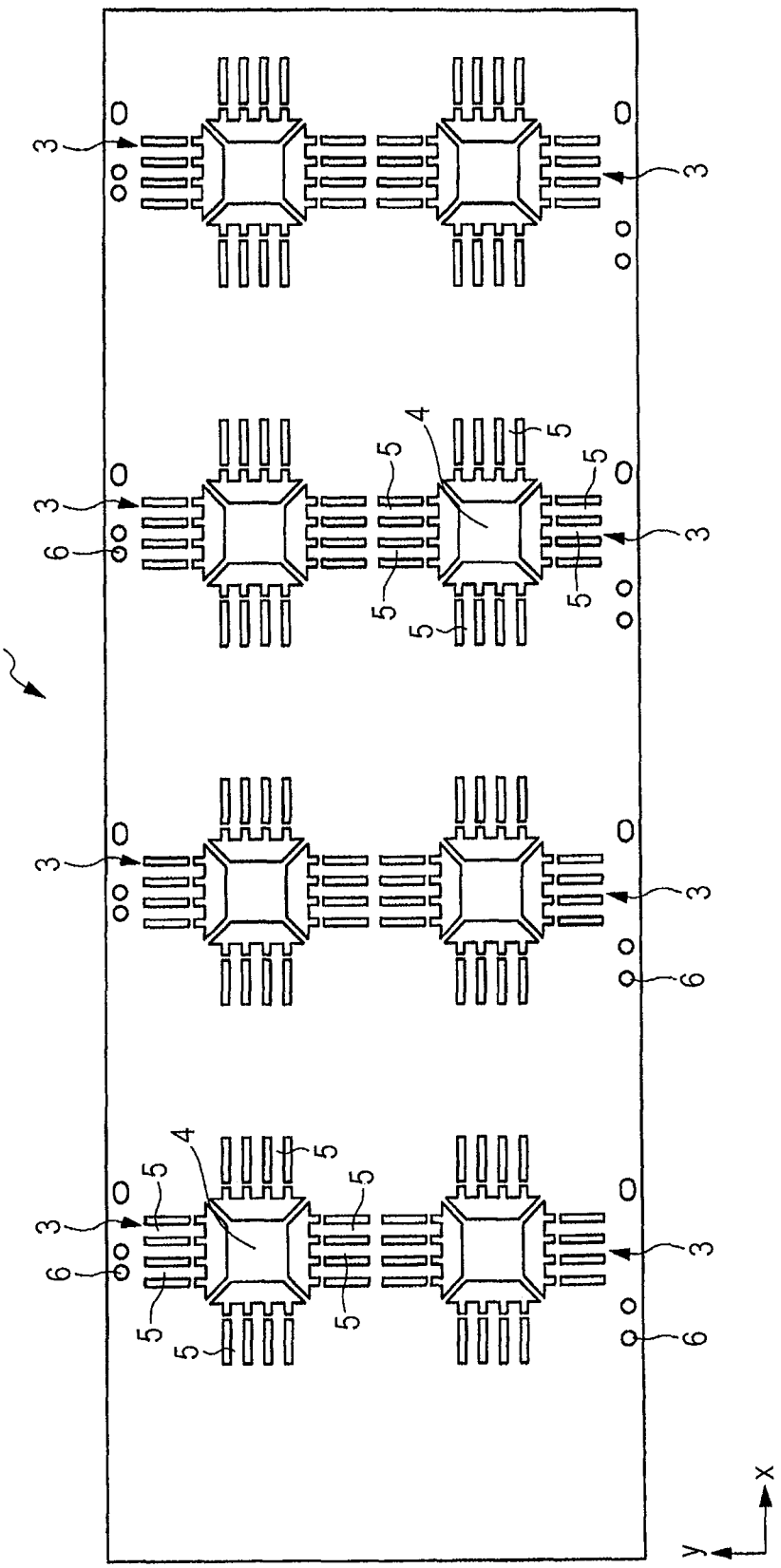
FIG. 2 is a top view of essential parts, illustrating an example of the outer shape of a lead frame according to First Embodiment of the invention.
Figure 3A:
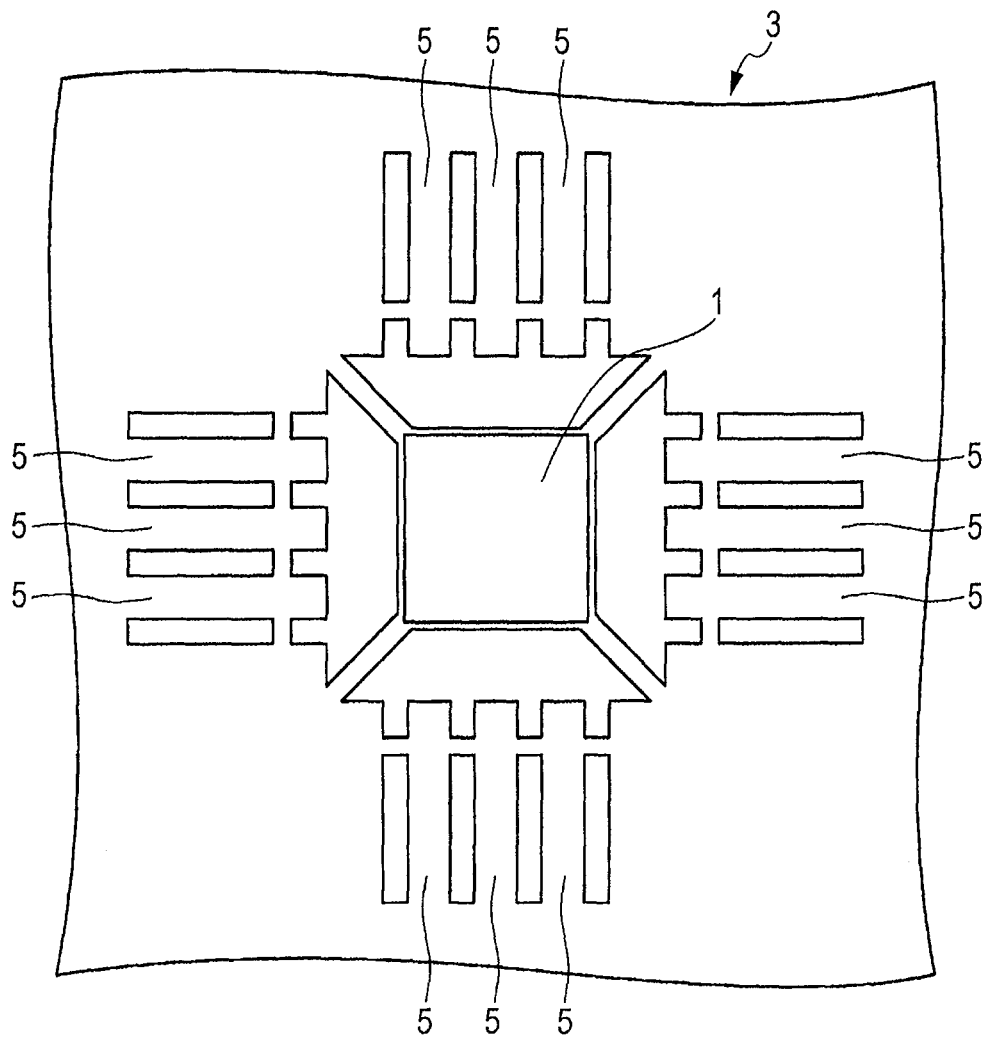
FIG. 3A is a top view of essential parts and FIG. 3B is a sectional view thereof, both explaining a product state in a die bonding step according to First Embodiment of the invention.
Figure 3B:
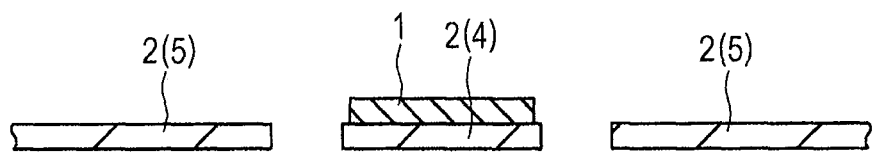
Figure 4A:
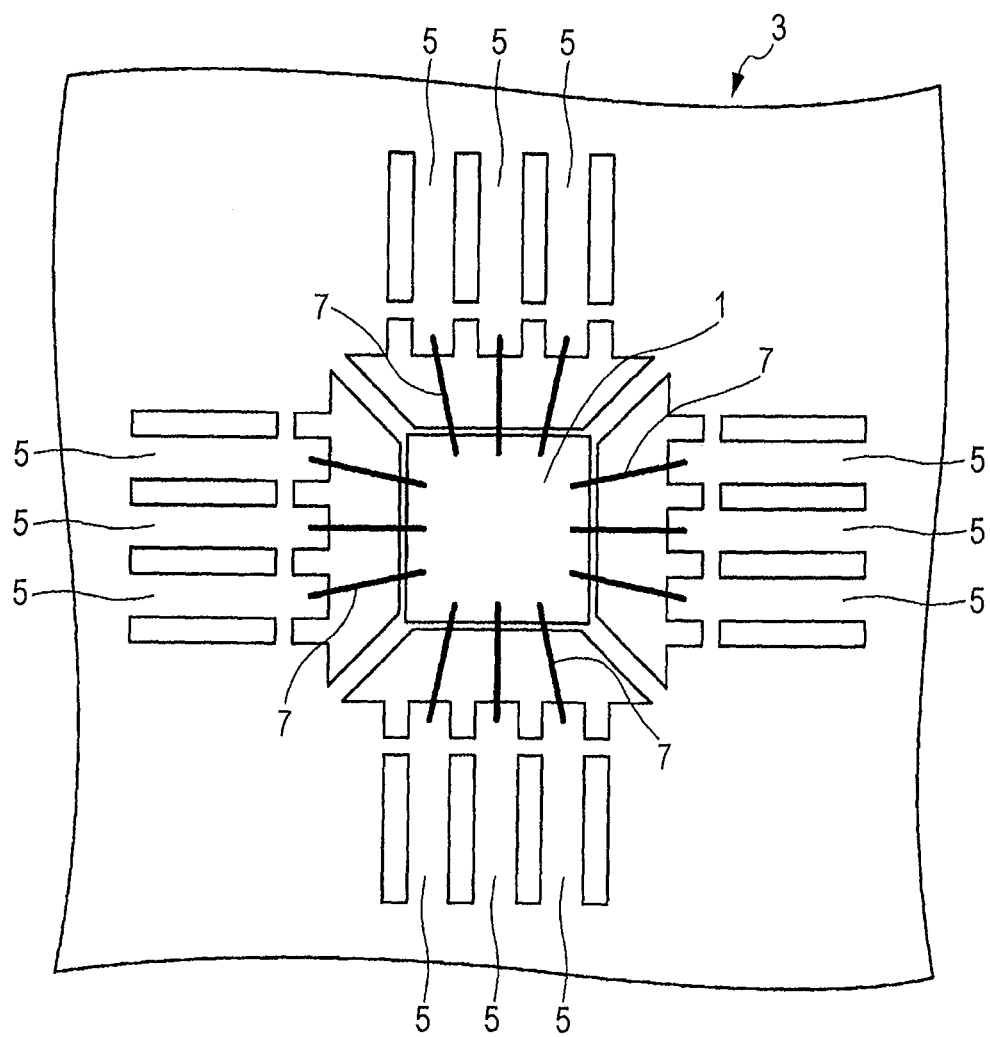
FIG. 4A is a top view of essential parts and FIG. 4B is a sectional view thereof, both explaining a product state in a wire bonding step according to First Embodiment of the invention.
Figure 4B:
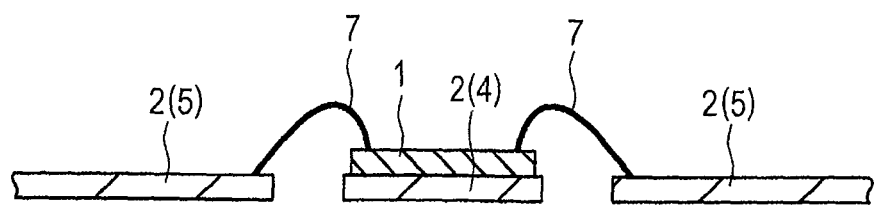
Figure 5A:
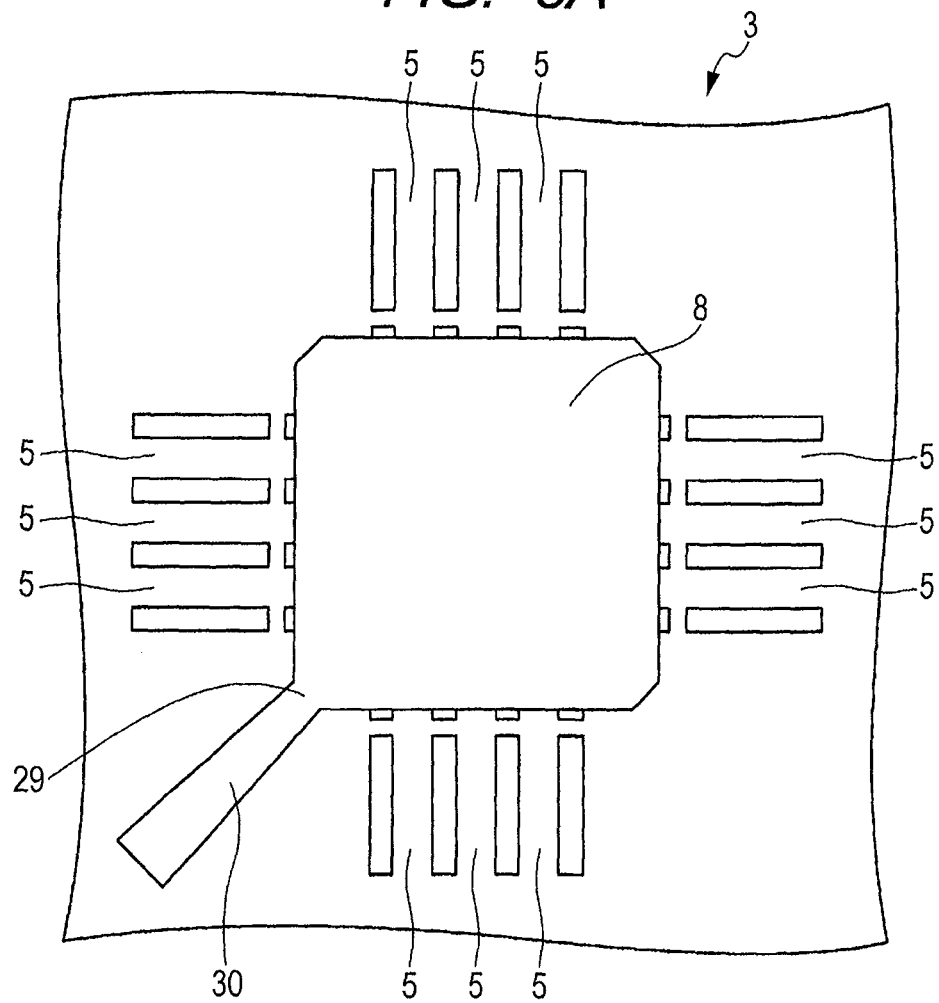
FIG. 5A is a top view of essential parts and FIG. 5B is a sectional view thereof, both explaining a product state in a molding step according to First Embodiment of the invention.
Figure 5B:
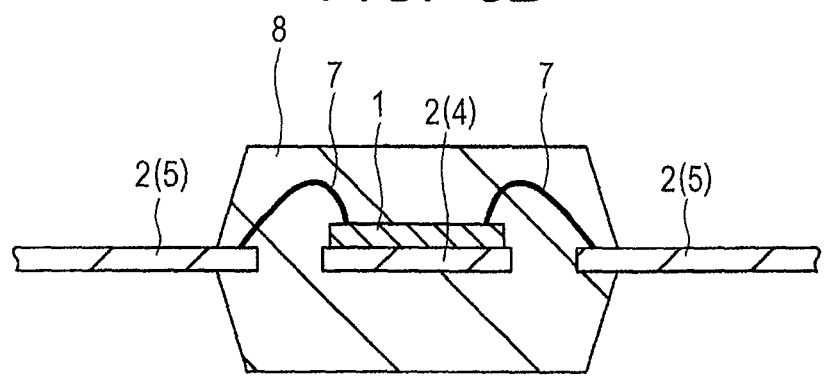
Figure 11:
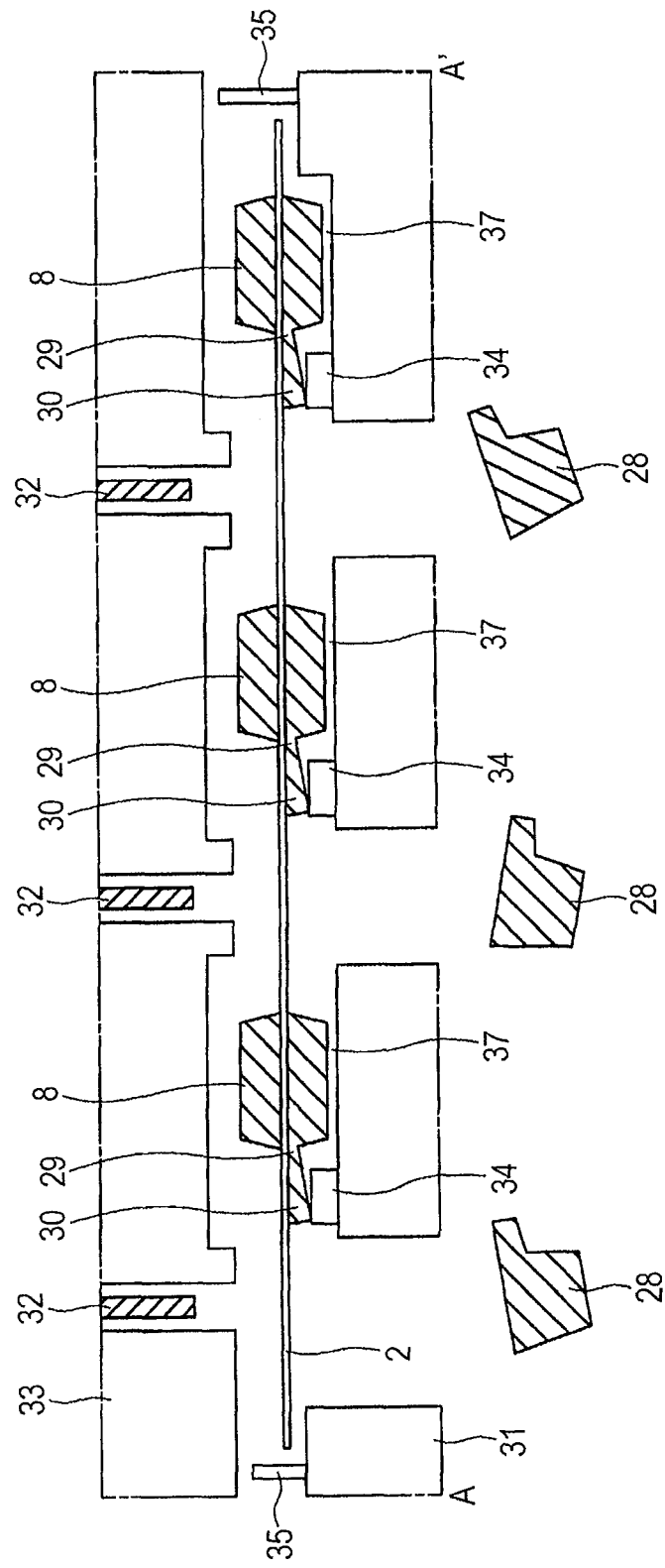
FIG. 11 is a sectional view of essential parts illustrating the gate break portion after the gate breaking, explaining an example of the gate breaking process according to First Embodiment of the invention.
Figure 12:
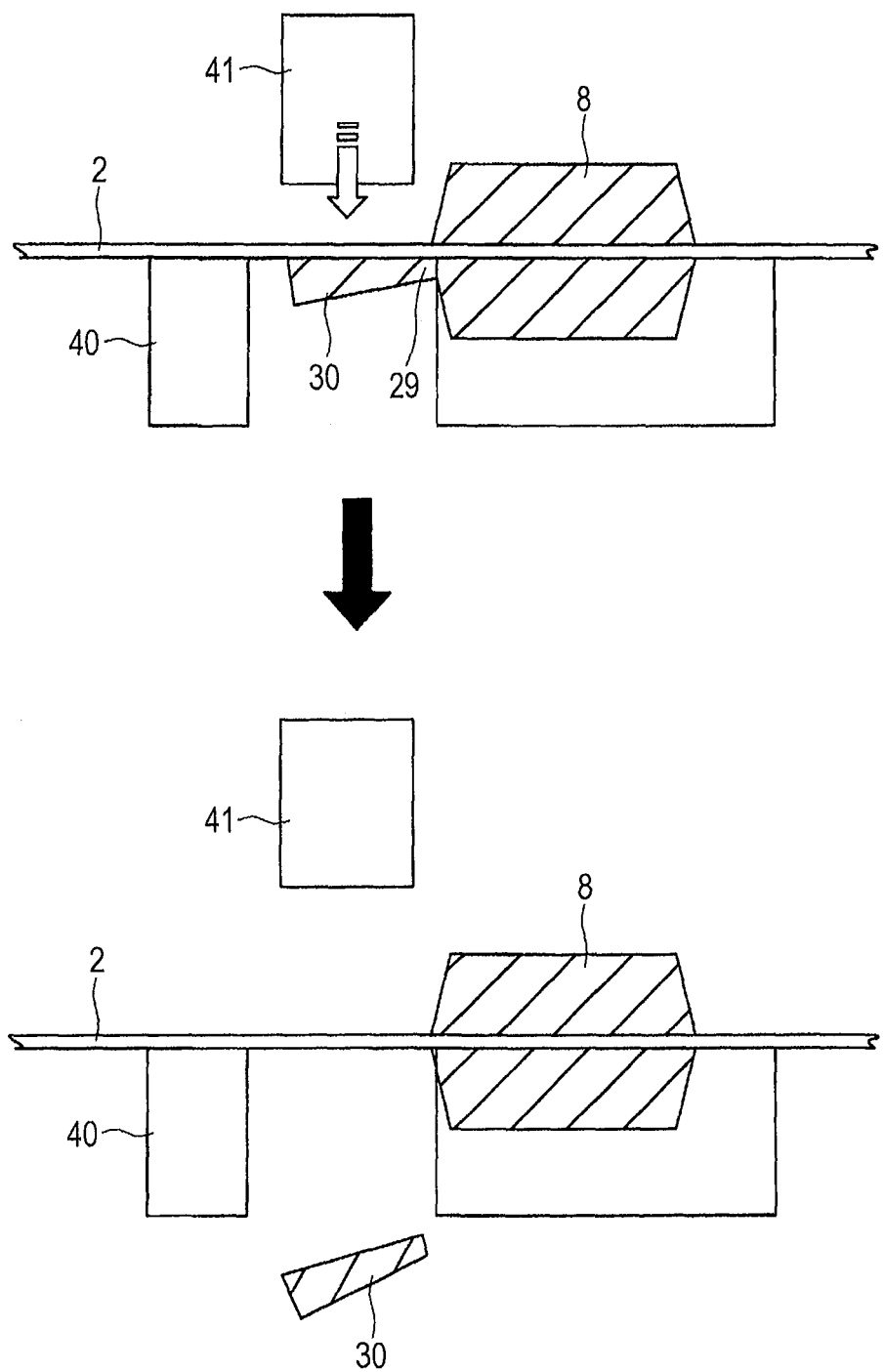
FIG. 12 is a sectional view of essential parts, explaining an example of a residual resin removing process in a residual gate removing step according to First Embodiment of the invention.
Figure 13:
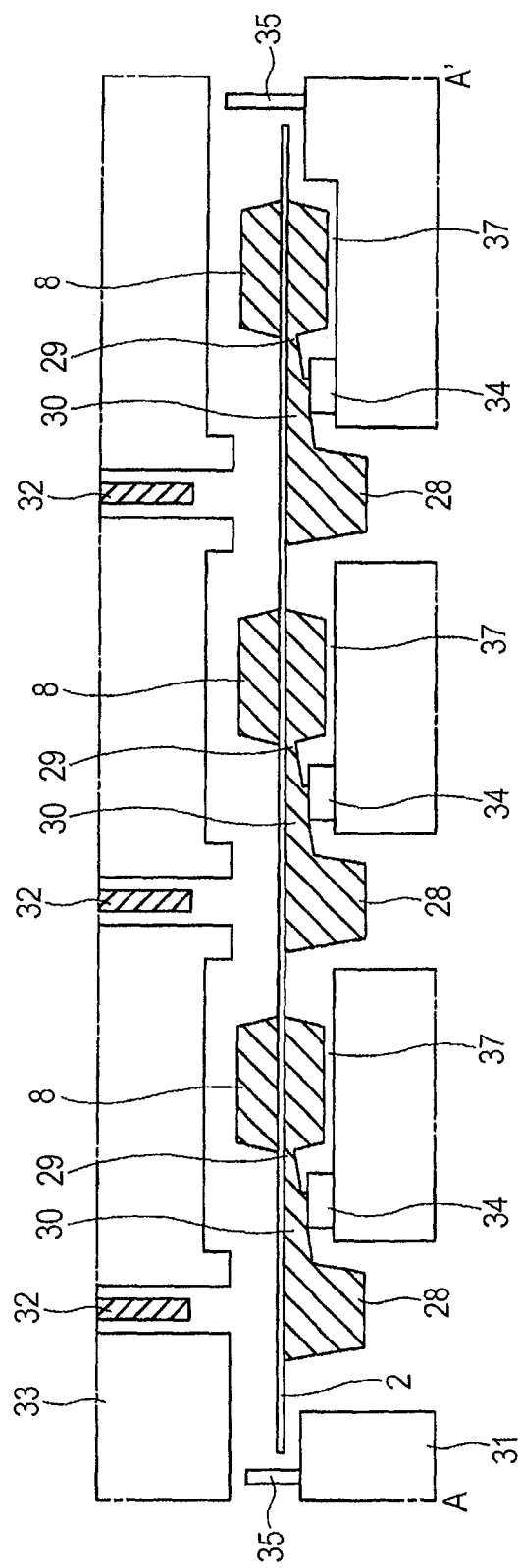
FIG. 13 is a sectional view of essential parts illustrating the gate break portion before the gate breaking, explaining a variation of the gate breaking process according to First Embodiment of the invention.
Figure 14:
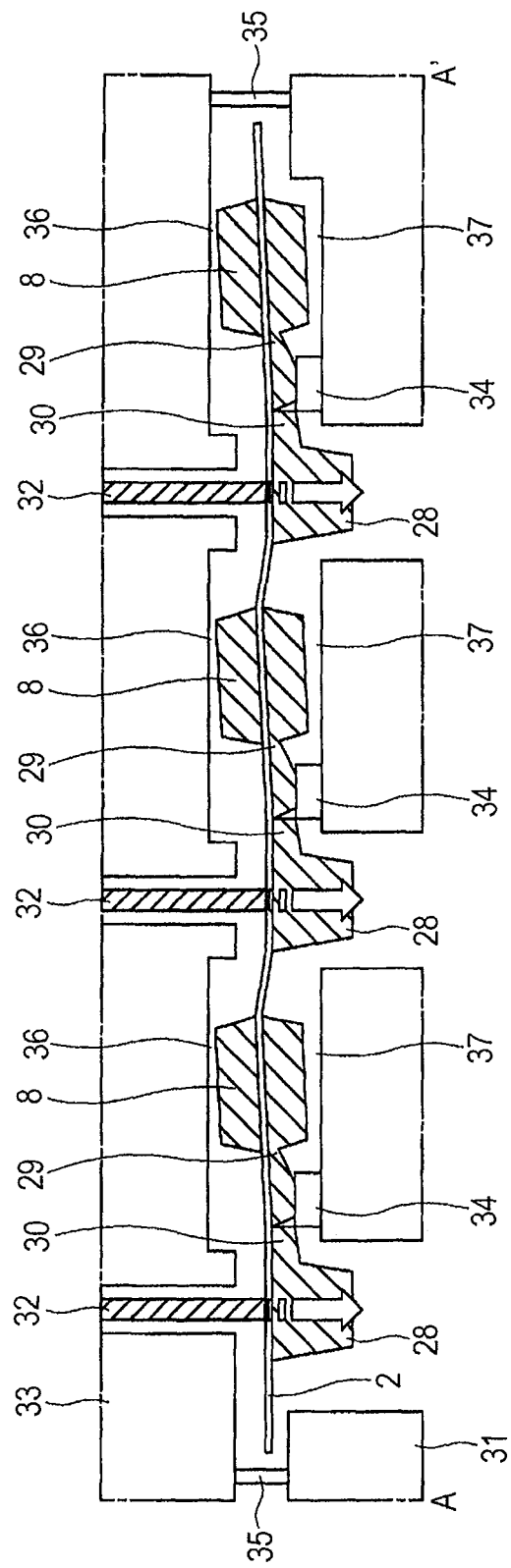
FIG. 14 is a sectional view of essential parts illustrating the gate break portion during the gate breaking, explaining a variation of the gate breaking process according to First Embodiment of the invention.
Figure 15A:
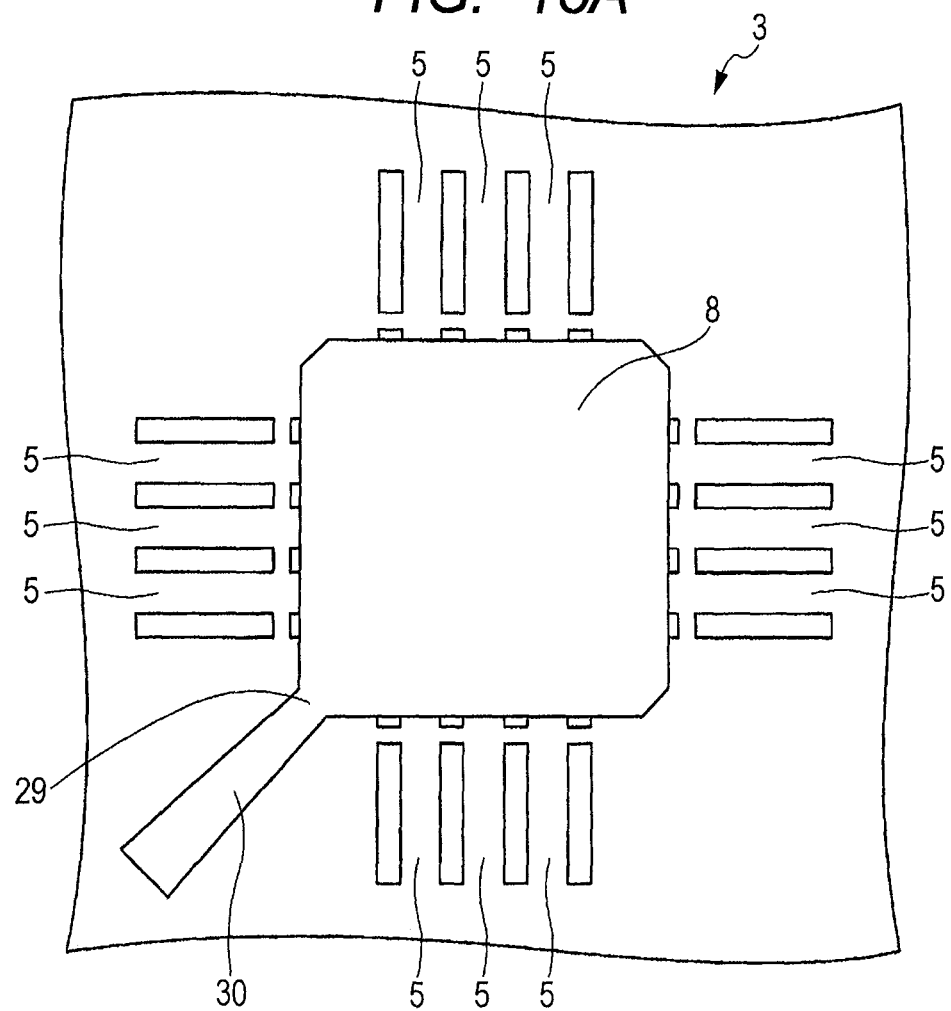
FIG. 15A is a top view of essential parts and FIG. 15B is a sectional view thereof, both explaining a product state in a plating step.
Figure 15B:
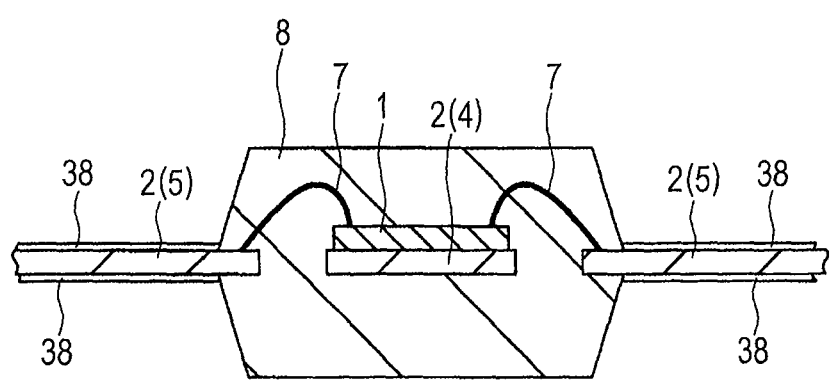
Figure 16A:
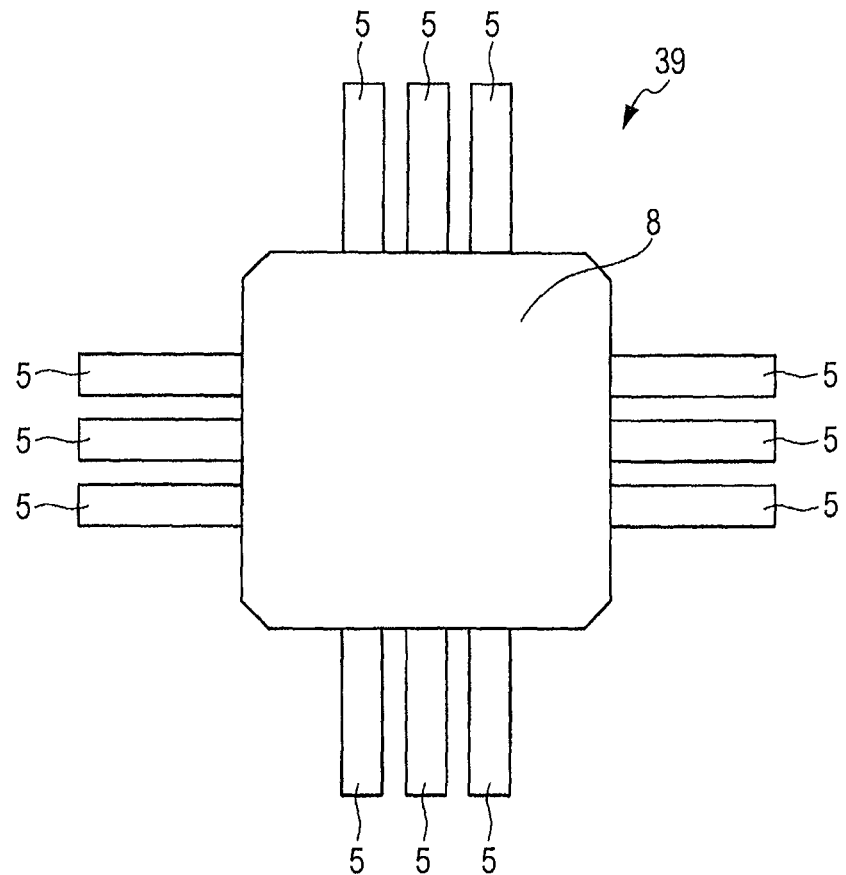
FIG. 16A is a top view of essential parts and FIG. 16B is a sectional view thereof, both explaining a product state in a lead cutting step.
Figure 16B:
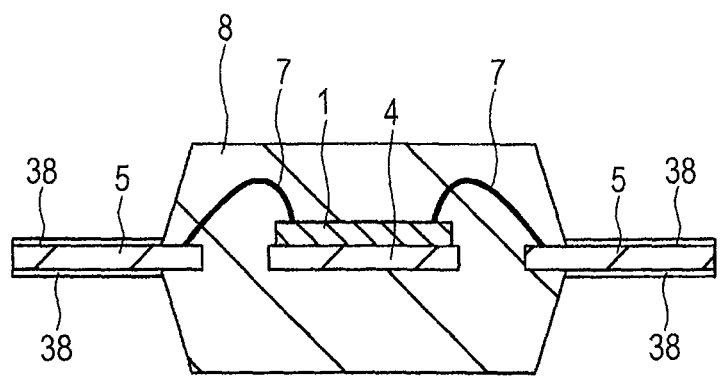
Figure 17A:
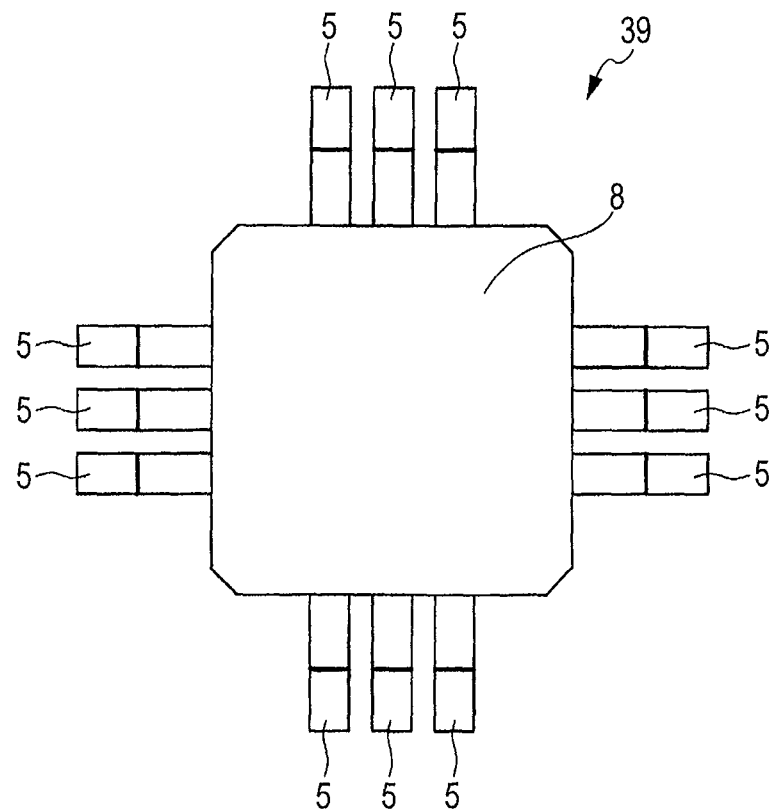
FIG. 17A is a top view of essential parts and FIG. 17B is a sectional view thereof, both explaining a product state in a forming step.
Figure 17B:
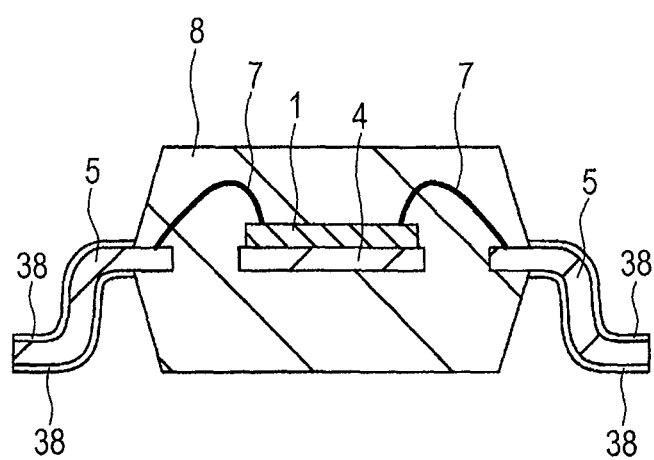

A method of manufacturing a semiconductor device according to the present First Embodiment 1 will be described with reference to FIGS. 1 to 17. FIG. 1 is a view illustrating the steps in the method of manufacturing a semiconductor device, and FIG. 2 is a top view of essential parts, illustrating an example of the outer shape of a lead frame. In addition, FIG. 3A is a top view of essential parts and FIG. 3B is a sectional view thereof, both explaining a product state in a die bonding step, FIG. 4A is a top view of essential parts and FIG. 4B is a sectional view thereof, both explaining a product state in a wire bonding step, FIG. 5A is a top view of essential parts and FIG. 5B is a sectional view thereof, both explaining a product state in a molding step. FIGS. 6 to 12 are views each explaining a gate breaking process in the molding step, and FIGS. 13 and 14 are sectional views of essential parts, each explaining a variation of the gate breaking process in the molding step. In addition, FIG. 15A is a top view of essential parts and FIG. 15B is a sectional view thereof, both explaining a product state in a plating step, FIG. 16A is a top view of essential parts and FIG. 16B is a sectional view thereof, both explaining a product state in a lead cutting step, and FIG. 17A is a top view of essential parts and FIG. 17B is a sectional view thereof, both explaining a product state in a forming step.

In the present invention, the gate breaking process in the molding step for the lead frame is a major feature, the detail, advantages, and the like of which will be made clear in the following description.

<<Semiconductor Chip Provision Step>>

An integrated circuit is formed over the circuit formation surface of a semiconductor wafer. The integrated circuit is formed, for every chip, over the semiconductor wafer in accordance with a predetermined manufacturing process in a manufacturing step referred to as a previous step or a diffusion step. Subsequently, after pass/fail of each semiconductor chip formed over the semiconductor wafer is determined, the semiconductor wafer is diced and divided into pieces of each semiconductor chip.

<<Lead Frame Provision Step>>

A lead frame (wiring board, wiring member) having a first surface (top surface, upper surface) and a second surface (back surface, lower surface) that is opposite to the first surface, which is a metal framework formed, for example, mainly of copper (Cu), is provided. An example of the lead frame is illustrated in FIG. 2. When it is assumed that, for example, the longitudinal direction (X-axis direction) of a lead frame 2 is a row and the direction perpendicular to the row (Y-axis direction) is a column, the lead frame 2 has a structure in which unit frames 3, each corresponding to one semiconductor product, are arranged in a matrix of 4 rows by 2 columns. A die pad (tab, chip mounting portion) 4, over which a semiconductor chip is to be mounted, is provided at the center of the each unit frame 3 located over the first surface of the lead frame 2, and a plurality of leads (external terminals) 5 are provided so as to surround the die pad 4. In addition, a plurality of holes 6 for positioning the lead frame 2 are provided around the lead frame 2.

In FIGS. 3A to 5B and FIGS. 15A and 15B each used for explaining an example of the method of manufacturing a semiconductor device, a region corresponding to one unit frame 3 is only illustrated. In each of FIGS. 8 to 11 and FIGS. 13 and 14, the lead frame 2 having a structure in which the unit frames 3 are arranged in a matrix of 3 rows by 2 columns is illustrated.

<<Die Bonding Step>>

Subsequently, as illustrated in FIGS. 3A and 3B, a semiconductor chip 1, which has been determined to be pass, is mounted over the upper surface of the die pad 4 in each unit frame 3 (first surface of the lead frame 2). At the time, the upper surface of the die pad 4 and the back surface of the semiconductor chip 1 are joined together by using, for example, a paste adhesive (e.g., silver (Ag) paste). The joint of the die pad 4 and the semiconductor chip 1 is not limited to one achieved by using a paste adhesive, but joint using, for example, gold-tin (Au—Sn) eutectic crystal, etc., may be adopted.

<<Wire Bonding Step>>

Subsequently, as illustrated in FIGS. 4A and 4B, a plurality of electrode pads (not illustrated) formed over the major surface (top surface) of the semiconductor chip 1 and a plurality of leads 5 are respectively and electrically coupled together via wires 7 by a nail head bonding (ball bonding) process combined with, for example, ultrasonic vibration for thermo compression bonding. Examples of the material for the wire 7 include metal materials, such as gold (Au), copper (Cu), and aluminum (Al). When Au is used, a gold wire having a diameter of, for example, 15 to 20 μm is frequently used.

<<Molding Step>>

Subsequently, as illustrated in FIGS. 5A and 5B, each semiconductor chip 1 mounted over the lead frame 2 is resin-sealed with a resin-sealing body (sealing body, package) 8.

Figure 7B:
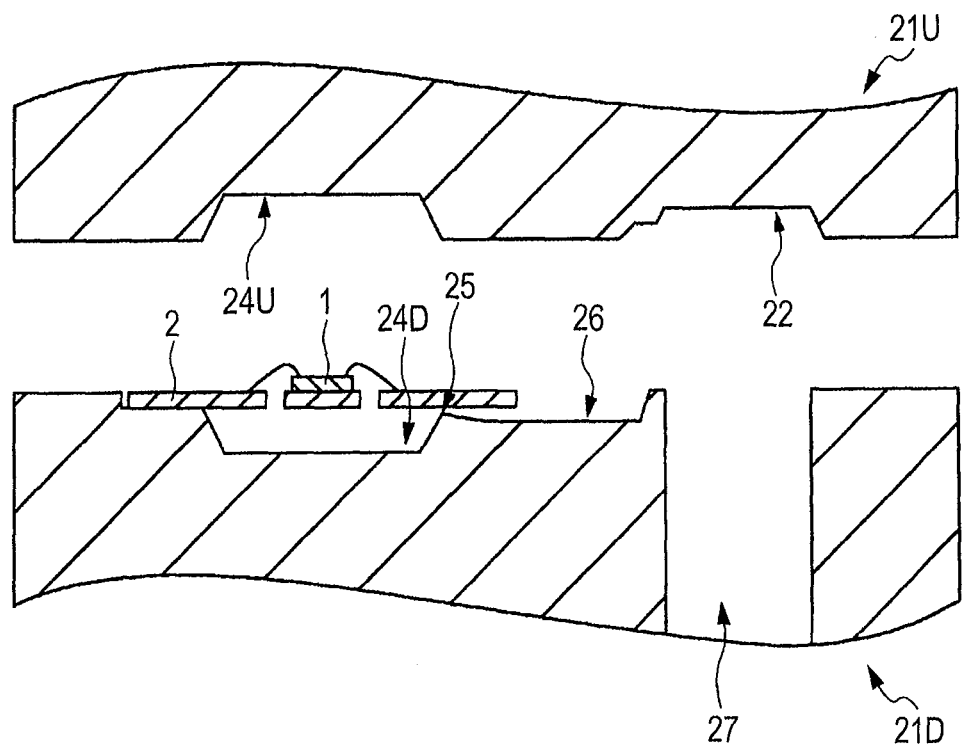
FIG. 7B is a sectional view essential parts in a state where the lower molding die and the upper molding die of the molding die illustrated in FIG. 7A are overlapped each other.
Figure 9:
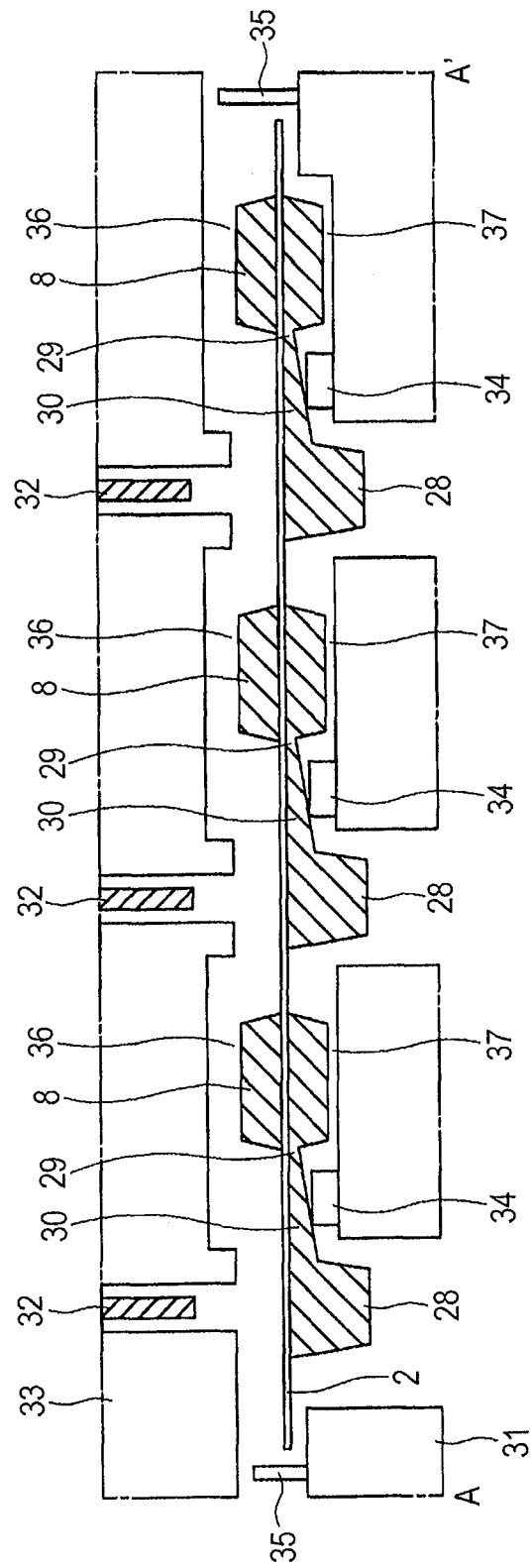
FIG. 9 is a sectional view of essential parts, taken along A-A' Line in FIG. 8.
Figure 10:
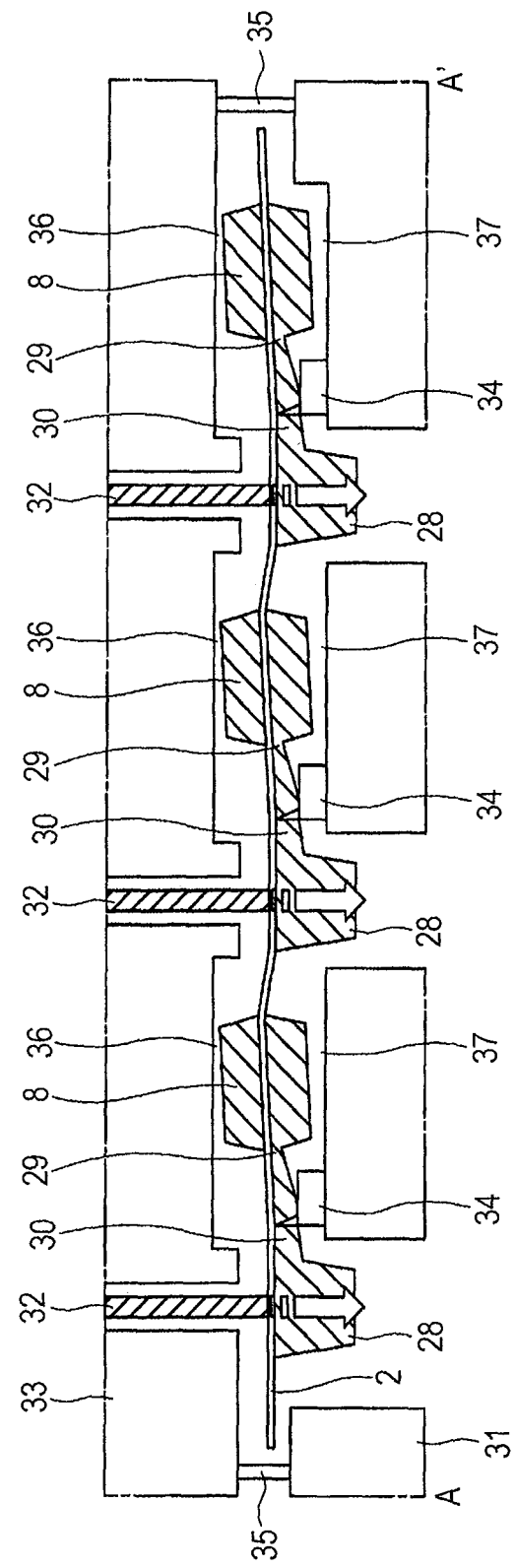
FIG. 10 is a sectional view of essential parts illustrating the gate break portion during the gate breaking, explaining an example of the gate breaking process according to First Embodiment of the invention.

Hereinafter, the molding step will be described in detail with reference to FIGS. 6 to 12. FIG. 6 is a schematic view explaining an example of the structure of a molding apparatus, FIG. 7A are plan views of essential parts, illustrating examples of a lower molding die (first molding die) and an upper molding die (second molding die) of a molding die included in the molding apparatus, respectively, and FIG. 7B is a sectional view of essential parts in a state where the lower molding die and the upper molding die of the molding die illustrated in FIG. 7A are overlapped each other. In addition, FIG. 8 is a top view of essential parts illustrating a gate break portion before gate breaking, explaining an example of a gate breaking process, FIG. 9 is a sectional view of essential parts, taken along A-A' Line in FIG. 8, FIG. 10 is a sectional view of essential parts illustrating the gate break portion during the gate breaking, explaining an example of the gate breaking process, and FIG. 11 is a sectional view of essential parts illustrating the gate break portion after the gate breaking, explaining an example of the gate breaking process. In addition, FIG. 12 is a sectional view of essential parts, explaining an example of a residual resin removing process in a residual gate removing step. In FIG. 8, the upper molding die of the molding die is omitted and a top view of essential parts is illustrated by seeing through the lead frame.

As illustrated in FIG. 6, the molding apparatus 9 is formed by: a first unit U1 including a frame supply portion 10, a frame alignment portion 11, and a tablet supply portion 12; three units (second unit U2, third unit U3, and fourth unit U4) in which mold forming is performed; and a fifth unit U5 including a gate break portion 13 and a product housing portion 14. Each of the second unit U2, the third unit U3, and the fourth unit U4, in which mold forming is performed, includes a molding die 15 and a press 16.

The lead frame 2 over which the semiconductor chip 1 is mounted and a tablet 17 are supplied in the first unit U1 (lead frame and tablet supply step), and the semiconductor chip 1 and part of the lead frame 2 are sealed with the resin-sealing body 8 in the second unit U2, third unit U3, or the fourth unit U4 (mold forming step). Further, an excessive resin leading to the resin-sealing body 8 is removed in the fifth unit U5 (gate breaking step), and a gate and part of a runner (residual resin), which remain without being separated from the resin-sealing body 8 even after the gate breaking step, are removed (residual gate removing step).

The molding apparatus 9 includes a loader 18 and an unloader 19. The lead frame 2 over which the semiconductor chip 1 is mounted and the tablet 17 are conveyed, by the loader 18, from the first unit U1 to the second unit U2, the third unit U3, or the fourth unit U4; and the resin-sealed lead frame 2 is conveyed, by the unloader 19, from the second unit U2, the third unit U3, or the fourth unit U4 to the fifth unit U5.

(1) Lead Frame and Tablet Supply Step

The lead frame 2, which has been subjected up to the wire bonding illustrated in the aforementioned FIG. 4, is first supplied to the frame supply portion 10 in the first unit U1. Subsequently, after the lead frame 2 is mounted over a table 20 in the frame alignment portion 11, the table 20 is moved, by the loader 18, from the frame alignment portion 11 to the tablet supply portion 12 such that the tablet 17 is mounted over the table 20 in the tablet supply portion 12. In FIG. 6, the case where two lead frames 2 and four tablets 17 are mounted over one table 20 is illustrated, but the number of the lead frames 2 and that of the tablets 17 are not limited to these numbers.

The table 20 over which the lead frames 2 and the tablets 17 are mounted is further conveyed, by the loader 18, from the first unit U1 to the second unit U2, the third unit U3, or the fourth unit U4.

(2) Mold Forming Step

In the second unit U2, the third unit U3, or the fourth unit U4, a sealing resin is formed by using the molding die 15. The molding die 15 has: a lower molding die (first molding die) in which the lead frame 2, over which the wire-bonded semiconductor chip 1 is mounted, is arranged; and an upper molding die (second molding die), which is located above the lower molding die to airtightly seal the lead frame 2 by engaging with the lower molding die.

As illustrated in FIG. 7A, a cull portion 22, which serves as an inflow source of a mold resin (melt resin, resin material), and a cavity portion 24U, which serves as a package region where the semiconductor chip 1 is resin-sealed, etc., are formed in the upper molding die (second molding die) 21U of the molding die 15.

The lower molding die (first molding die) 21D of the molding die 15 has a structure corresponding to that of the upper molding die 21U. A first runner portion 23 that is linked to the cull portion 22 to serve as a major inflow channel of the mold resin, a cavity portions 24D that serves as a package region where the semiconductor chip 1 is resin-sealed, a gate portion 25 that serves as a gate when the mold resin flows into the cavity portions 24U and 24D and that is linked to the cavity portion 24D, and a second runner portion 26 whose one side is linked to the gate portion 25 and the other side is linked to the first runner portion 23, etc., are formed in the lower molding die 21D. Each of the gate portion 25 and the second runner portion 26 is formed such that, when viewed from upside, the width thereof is smaller than that of the first runner portion 23. Further, a pot portion into which the tablet 17 is put is formed in the lower molding die 21D, and a plunger that moves up/down is provided in the pot portion.

As illustrated in FIG. 7B, the lead from 1 is set in the molding die 15 such that, when the upper molding die 21U and the lower molding die 21D of the molding die 15 are closed together, the first surface of the lead frame 2 over which the semiconductor chip 1 is mounted is located near to the upper molding die 21U and the second surface, opposite to the first surface, is located near to the lower molding die 21D.

The tablet 17 is first put into the pot portion in the lower molding die 21D. An object obtained by solidifying, with pressure, a mold resin, such as, for example, a halogen-free resin, is used as the tablet 17. Further, the lead frame 2 is set over the lower molding die 21D such that each of the semiconductor chips 1 is positioned in each of the cavity portions 24U in the upper molding die 21U.

Subsequently, the upper molding die 21U and the lower molding die 21D of the molding die 15 are closed together. At the time, the lead frame 2 is sandwiched between the upper molding die 21U and the lower molding die 21D without creating a gap such that the mold resin does not leak, thereby fixing the lead frame 2.

Subsequently, the tablet 17 is pressed by elevating the plunger, and a mold resin, which is made with the tablet 17 being melted and flowing, is moved from the pot portion by applying pressure. The mold resin flows into the cavity portions 24U and 24D through the cull portion 22, the first runner portion 23, the second runner portion 26, and the gate portion 25, thereby allowing all of the cavity portions 24U and 24D to be filled with the mold resin.

Subsequently, when a sealing resin, such as the resin-sealing body 8, etc., is formed with the mold resin hardening after a lapse of a predetermined period of time, the upper molding die 21U and the lower molding die 21D of the molding die 15 are opened, so that the lead frame 2 over which the sealing resin is formed is taken out of the molding die 15. Thereafter, the table 20, over which the lead frame 2 over which the sealing resin is formed is mounted, is conveyed, by the unloader 19, from the second unit U2, the third unit U3, or the fourth unit U4 to the fifth unit U5.

(3) Gate Breaking Step

An excessive resin leading to the resin-sealing body 8 is removed from the sealing resin in the gate break portion 13 in the fifth unit U5.

That is, as illustrated in the aforementioned FIGS. 5A and 5B and FIGS. 8 and 9, a first runner 28, a gate 29, and a second runner (sub-runner) 30, which are formed with the mold resin that has flowed into the first runner portion 23, the gate portion 25, and the second runner portion 26 in the lower molding die 21D of the molding die 15 hardening, are respectively formed over the second surface of the lead frame in the aforementioned mold forming step, in addition to the resin-sealing body 8 in which the semiconductor chip 1 and part of the lead frame 2 are resin-sealed. Accordingly, it is needed to separate the first runner 28, the gate 29, and the second runner 30 from the resin-sealing body 8.

A table 31 over which the lead frame 2 is mounted is arranged below the gate brake portion 13, and a clamper 33, which waits above the lead frame 2 and has a break pin 32, is arranged above the gate break portion 13. A first supporting portion 34 for holding the second runner 30 formed over the first surface of the lead frame 2 is arranged over the table 31.

The first supporting portion 34 is formed, for example, of a silicone rubber or a fluororubber. The hardness of the first supporting portion 34 is lower than that of the molding die 15 used in the aforementioned mold forming, and further lower than that of the resin-sealing body 8. It is considered that the hardness of the first supporting portion 34 is preferably within a range lower than, for example, 90 Shore A (it is needless to say that the hardness is not limited to this range depending on other conditions). It is considered that the hardness thereof is most preferably within a range of 50 to 80 Shore A. Because it is structured that the second runner 30 is held by the first supporting portion 34, a space 37 can be provided between the resin-sealing body 8 and the table 31. The Shore A is a standard for measuring the hardness of a general rubber. A Shore A measured value is obtained in the following way: based on the test method specified in JIS (Japanese Industrial Standards) K 6253, an object to be measured is deformed by pressing down the surface thereof with an indenter, and an amount of the deformation (depth of the pressing down) is measured, which is then converted into a numeral value by using a durometer (spring-type rubber hardness meter).

In addition, a stopper 35 is set in part of the periphery of the table 31 (two places in First Embodiment) so as to be located between the table 31 and the clamper 33. With this stopper 35, a space 36 can be provided between the resin-sealing body 8 and the clamper 33, even when the clamper 33 is moved down toward the table 31.

As illustrated in the aforementioned FIG. 9, the lead frame 2 over which a sealing resin, such as the resin-sealing body 8, is formed is mounted over the table 31 in the gate break portion 13. At the time, the lead frame 2 is mounted in such a way that: the first surface of the lead frame 2 over which the semiconductor chip 1 is mounted is oriented upward; and the first supporting portion 34 supports the second runner 30. The space 37 is formed between the resin-sealing body 8 and the table 31.

Subsequently, as illustrated in FIG. 10, the clamper 33 is moved down before the clamper 33 contacts the stopper 35. At the time, the space 36 is formed between the resin-sealing body 8 and the clamper 33, and hence the resin-sealing body 8 is in a condition of floating in the air. Subsequently, the break pin 32 is inserted down, in the direction from the side of the first surface of the lead frame 2 toward the side f the second surface thereof, from a hole formed in the lead frame 2. With the break pin 32 being inserted down, stress is applied to the portion in the second runner 30 where the second runner 30 contacts the first supporting portion 34, which makes the first supporting portion 34 serve as a rotation fulcrum point while the first supporting portion 34 is being elastically deformed. Thereby, the second runner 30 is surely bent, which generates a pre-crack at or near to the portion in the second runner 30 where the second runner 30 contacts the first supporting portion 34.

Further, as illustrated in FIG. 11, a middle of the second runner 30 (position where the pre-crack has been generated) is broken by pushing down the first runner 28 with the break pin 32, thereby allowing the first runner 28 to be separated from the middle of the second runner 30.

At the time, because the space 37 is present between the resin-sealing body 8 and the table 31 and the space 36 is present between the resin-sealing body 8 and the clamper 33, the resin-sealing body 8 does not hit the table 31 and the clamper 33, even when the break pin 32 is inserted down. Thereby, it can be prevented that a flaw may be caused over the surface of the resin-sealing body 8.

In addition, the second runner 30 can be cut at an almost constant position by generating a pre-crack at or near to the portion in the second runner 30 where the second runner 30 contacts the first supporting portion 34. That is, the position where the second runner 30 is cut can be stabilized. Further, it becomes possible to understand (manage) the length of each of the gate 29 and part of the second runner 30, which remain without being separated from the resin-sealing body 8.

(4) Residual Gate Removing Step

Subsequently, as illustrated in FIG. 12, a cutting punch 41 is brought down from the side of the first surface of the lead frame 2 onto part of the second runner 30 that remains without being separated from the resin-sealing body 8, so that the gate 29 and the part of the second runner 30 are removed from the resin-sealing body 8. As stated above, because the gate 29 and part of the second runner 30 each having a stable length remain, these can be cut and removed in good reproducibility by providing and using a cutting jig (die 40 and cutting punch 41) that has been adjusted to the shapes of these residual resins in advance. Accordingly, there is not caused the problem that the die 40 may be damaged, a cut position may be shifted, a flaw may be caused over the surface of the semiconductor device 39 (resin-sealing body 8), or the like.

Further, even when a halogen-free resin having large adhesion strength with the lead frame 2 is used, the first runner 28 can be separated from the middle of the second runner 30 in the gate breaking step, because a pre-crack is generated in the middle of the second runner 30.

Thereafter, the lead frame 2 is housed in the product housing portion 14. Further, the lead frame 2 is taken out of the molding apparatus 9 to be conveyed to the subsequent postmold baking step.

Subsequently, a variation of the gate braking process will be described with reference to FIGS. 13 and 14. FIG. 13 is a sectional view of essential parts illustrating the gate break portion before the gate breaking, explaining a variation of the gate breaking process, and FIG. 14 is a sectional view of essential parts illustrating the gate break portion during the gate breaking, explaining a variation of the gate breaking process.

In the aforementioned mold forming step, the second runner 30 located between the resin-sealing body 8 and the first runner 28 is formed such that the thickness thereof becomes smaller as approaching the resin-sealing body 8 from the first runner 28, as illustrated in, for example, the aforementioned FIG. 9.

In the variation, each semiconductor chip 1 mounted over the lead frame 2 is resin-sealed with the resin-sealing body 8 in the same way as in the aforementioned mold forming step. As illustrated in FIG. 13, however, a flat portion having a constant thickness is formed in part of the second runner 30. This flat portion is formed so as to contact the upper surface of the first supporting portion 34 used in the aforementioned gate breaking step. The thickness of the second runner 30 other than the flat portion is smaller as approaching the resin-sealing body 8 from the first runner 28.

As illustrated in FIG. 14, the break pin 32 is inserted down in the direction from the side of the first surface of the lead frame 2 toward the side of the second surface thereof. With the break pin 32 being inserted down, stress is applied to the boundary between the flat portion and the tapered portion in the second runner 30 near to the first runner, which makes the first supporting portion 34 serve as a rotation fulcrum point while the first supporting portion 34 is being elastically deformed. Thereby, the second runner 30 is surely bent, which generates a pre-crack at the boundary. At the time, the aforementioned stress concentrates on the boundary between the flat portion and the tapered portion in the second runner 30, and hence a pre-crack is more likely to be generated than in the case where the whole second runner 30 has a tapered shape.

<<Post-Mold Baking Step>>

Subsequently, in order to further accelerate the hardening of the resin-sealing body 8 and in order to enhance the adhesiveness with the lead frame 2, an annealing treatment is performed on the resin-sealing body 8 in which the semiconductor chip 1 and part of the lead frame 2 have been resin-sealed. The annealing treatment is performed, for example, at a temperature within a range of approximately 160 to 190° C. for approximately 7 hours.

<<Plating Step>>

Subsequently, as illustrated in FIGS. 15A and 15B, a plating treatment is performed on the lead frame 2. Thereby, a plating layer 38, which is comprised of tin (Sn), tin-silver (Sn—Ag) alloy, tin-copper (Sn—Cu) alloy, tin-bismuth (Sn—Bi) alloy, or tin-lead (Sn—Pb) alloy each having a thickness of, for example, 10 μm or less, is formed over the surface of each of the leads 5 protruding from the resin-sealing body 5.

<<Lead Cutting Step>>

Subsequently, as illustrated in FIGS. 16A and 16B, each semiconductor device (semiconductor product) 39 is cut out by cutting the leads 5 with a cutting apparatus. At the time, each semiconductor device 39 is cut from the main body of the lead frame 2 by moving forward, with respect to the lead frame 2 placed, for example, over the die (holder for a molding die) provided in the cutting apparatus, the cutting punch (cutting tooth) provided in the cutting apparatus from the side of the second surface of the lead frame 2 toward the side of the first surface thereof. Herein, the direction in which the cutting punch is moved forward is not particularly limited, but cutting burrs (not illustrated) remaining at the tip of the lead 5 are further oriented upward when the cutting tooth is moved from the side of the second surface of the lead frame 2 toward the side of the first surface thereof, and hence a mounting defect, caused by the cutting burrs, can be prevented when the semiconductor device is mounted over a mount board.

<<Forming Step>>

Subsequently, as illustrated in FIGS. 17A and 17B, the lead 5 exposed from the resin-sealing body 8 is formed into a predetermined shape by a forming molding die.

In the aforementioned description, the semiconductor device 39 is manufactured in the order of the plating step, the lead cutting step, and the forming step; however, the plating step and the forming step may be sequentially performed after the lead cutting step.

<<Inspection Step>>

Subsequently, the semiconductor devices 39 are sorted into good products and defective products after an inspection step in which an electrical inspection and a visual inspection are performed in accordance with product standards.

<<Shipping Step>>

Subsequently, the semiconductor device 39 determined to be good is shipped.

Thus, according to the present First Embodiment 1, a pre-crack is generated, in good reproducibility, at an almost constant position in the middle of the second runner 30 located between the resin-sealing body 8 and the first runner 28. Thereby, even when a halogen-free resin having large adhesion strength with the lead frame is used, the second runner 30 can be cut, in the gate breaking step, at an almost constant position in the middle of the second runner 30. Accordingly, the length of each of the gate 29 and part of the second runner 30, which remain without being separated from the resin-sealing body 8, is made almost constant, and a cutting jig, which has been adjusted to these residual resins, can be used. Thereby, these residual resins can be cut, in good reproducibility, without being sandwiched between the die 40 and the lead frame 2. As a result, occurrence of a problem in the residual gate removing step can be suppressed, the problem being that the die 40 may be damaged, a cut position may be shifted, a flaw may be caused over the surface of the semiconductor device 39, or the like.

(Second Embodiment)

In the present Second Embodiment, an example of a gate breaking process will be described, in which an excessive resin leading to a resin-sealing body is removed from a sealing resin in which a flow CAV (Cavity) is provided in part of a second runner. The processes of manufacturing a semiconductor device other than a molding step are approximately the same as in the aforementioned First Embodiment, and hence description thereof will be omitted herein.

Figure 19:
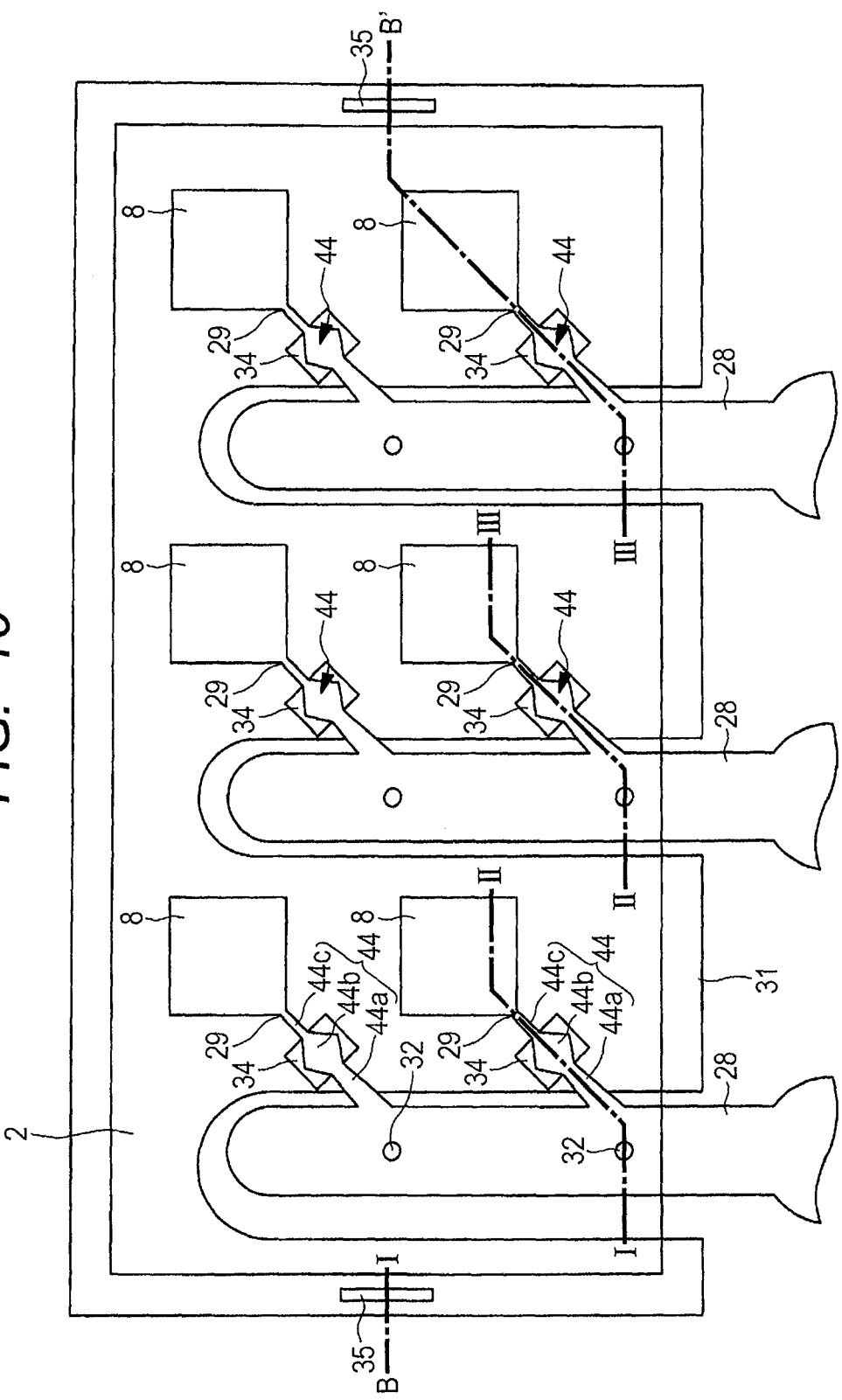
FIG. 19 is a top view of essential parts illustrating a gate break portion before gate breaking, explaining an example of a gate breaking process according to Second Embodiment of the invention.
Figure 20:
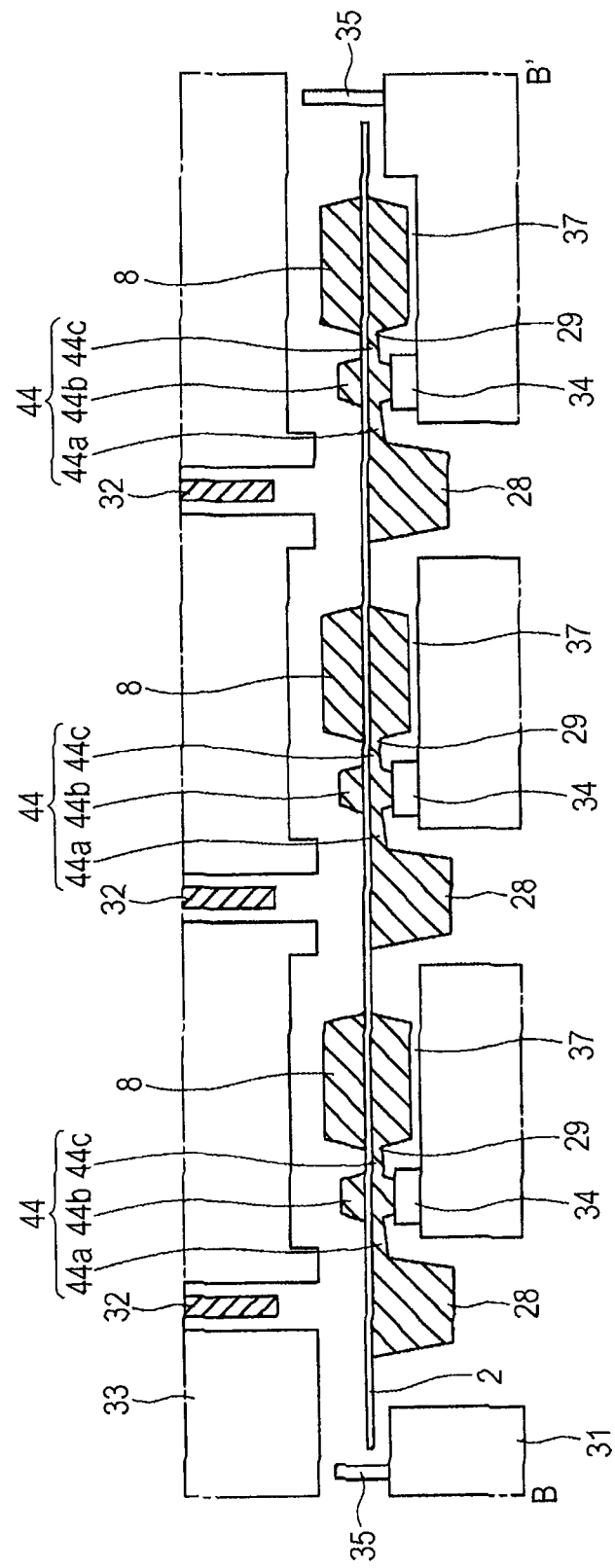
FIG. 20 is a sectional view of essential parts, taken along B-B' Line in FIG. 19.
Figure 21:
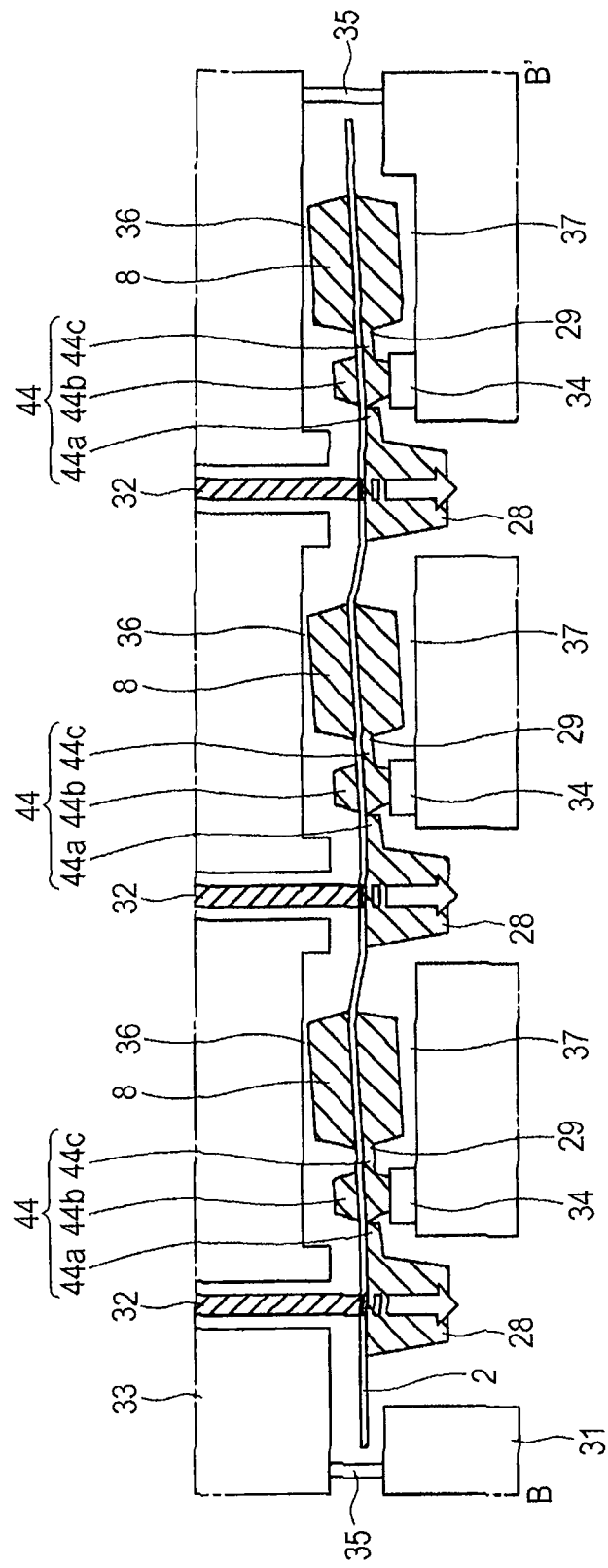
FIG. 21 is a sectional view of essential parts illustrating the gate break portion during the gate breaking, explaining an example of the gate breaking process according to Second Embodiment of the invention.

A method of manufacturing a semiconductor device according to the present Second Embodiment will be described in the order of the steps, with reference to FIGS. 18 to 22. FIG. 18 are plan views of essential parts, illustrating examples of a lower molding die (first molding die) and an upper molding die (second molding die) of a molding die included in a molding apparatus. FIG. 19 is a top view of essential parts illustrating a gate break portion before gate breaking, explaining an example of a gate breaking process, FIG. 20 is a sectional view of essential parts, taken along B-B' Line in FIG. 19, and FIG. 21 is a sectional view of essential parts illustrating the gate break portion during the gate breaking, explaining an example of the gate breaking process. In addition, FIG. 22 is a sectional view of essential parts, explaining an example of a residual resin removing process in a residual gate removing step. In FIG. 19, the upper molding die of a molding die is omitted and a top view of essential parts is illustrated by seeing through a lead frame.

<<Molding Step>>

Each semiconductor chip 1 mounted over the lead frame 2 is resin-sealed with the resin-sealing body 8 by using the molding apparatus 9 described in the aforementioned FIG. 6.

(1) Lead Frame and Tablet Supply Step

In the same way as in the aforementioned First Embodiment, the lead frame 2 and the tablet 17 are first provided in the first unit U1, and the two are then conveyed, by the loader 18, from the first unit U1 to the second unit U2, the third unit U3, or the fourth unit U4.

(2) Mold Forming Step

A sealing resin is formed in the second unit U2, the third unit U3, or the fourth unit U4 by using a molding die.

As illustrated in FIG. 18, the first runner portion 23, the cavity portion 24D, the gate portion 25, a second runner portion 43, and a pot portion into which the tablet 17 is put, etc., are formed in a lower molding die 42D of the molding die. Further, a dent portion 43b having a concave shape (hereinafter, referred to as a flow CAV portion) is formed at the center of the second runner portion 43. That is, the second runner portion 43 is formed by: a first portion having a first depth and is linked to the first runner portion 23; a third portion having a third depth and is linked to the cavity portion 24D; and a second portion (flow CAV portion 43b) having a second depth that is larger than each of the first depth and the third depth, one side of which is linked to the first portion and the other side of which is linked to the third portion. In addition, the second runner portion 43 is formed such that, when viewed from upside, the width of the second portion (flow CAV portion 43b) is larger than that of each of the first portion and third portion. The flowability of a mold resin can be improved by forming the flow CAV portion 43b at the center of the second runner portion 43.

An upper molding die 42U of the molding die has a structure corresponding to that of the lower molding die 42D, and the cull portion 22 and the cavity portion 24U that serves as a package region where the semiconductor chip 1 is resin-sealed, etc., are formed. Further, a flow CAV portion 43a is formed at a position where, when the upper molding die 42U and the lower molding die 42D are closed together, the portion 43a faces the flow CAV portion 43b formed in the lower molding die 42D. The flow CAV portion 43a has a shape approximately the same as that of the aforementioned flow CAV portion 43b.

Further, the lead frame 2 is set in the molding die such that, when the upper molding die 42U and the lower molding die 42D of the molding die are closed together, the first surface of the lead frame 2 over which the semiconductor chip 1 is mounted is located near to the upper molding die 42U and the second surface, opposite to the first surface, is located near to the lower molding die 42D.

In the same way as in the aforementioned First Embodiment, a sealing resin is formed by flowing a mold resin, for example, a halogen-free resin into the space sandwiched by the upper molding die 42U and the lower molding die 42D of the molding die and by hardening the resin. Thereafter, the lead frame 2 over which the sealing resin is formed is conveyed, by the unloader 19, from the second unit U2, the third unit U3, or the fourth unit U4 to the fifth unit U5.

(3) Gate Breaking Step

In the gate break portion 13 in the fifth unit U5, an excessive resin leading to the resin-sealing body 8 is removed from the sealing resin. That is, as illustrated in FIGS. 19 and 20, the first runner 28 and the gate 29, which are formed with the mold resin that has flowed into the first runner portion 23 and the gate portion 25 in the lower molding die 42D of the molding die hardening, are respectively formed over the second surface of the lead frame 2 in the aforementioned mold forming step, in addition to the resin-sealing body 8 in which the semiconductor chip 1 and part of the lead frame 2 are resin-sealed.

Further, in the second runner portion 43, a first portion 44a and a third portion 44c, which are formed with the mold resin that has flowed into the first portion and the third portion in the lower molding die 42D hardening, are respectively formed over the second surface of the lead frame 2; and a second portion (flow CAV) 44b, which is formed with the mold resin that has flowed into the second portion (flow CAV portion 43b) in the lower molding die 42D and the flow CAV portion 43a in the upper molding die hardening, is formed over the first surface and the second surface of the lead frame 2. Accordingly, it is needed to separate the first runner 28, the gate 29, and a second runner (sub-runner) 44 formed by the first portion 44a, the second portion (flow CAV) 44b, and the third portion 44c, from the resin-sealing body 8.

As illustrated in the aforementioned FIGS. 19 and 20, the lead frame 2 over which a sealing resin, such as the resin-sealing body 8, is formed is mounted over the table 31 in the gate break portion 13. At the time, the lead frame 2 is mounted in such a way that: the first surface of the lead frame 2 over which the semiconductor chip 1 is mounted is oriented upward; and the first supporting portion 34 arranged over the table 31 supports the second runner 44. The space 37 is formed between the resin-sealing body 8 and the table 31.

Herein, the second runner 44 is formed by: the first portion 44a having a first thickness and coupled to the first runner 28; a third portion 44c having a third thickness and coupled to the resin-sealing body 8; and a second portion (flow CAV) 44b having a second thickness larger than each of the first thickness and the third thickness, one side of which is coupled to the first portion 44a and the other side of which is coupled to the third portion 44c. The first portion 44a and the third portion 44c are formed over the second surface of the lead frame 2, and the second portion (flow CAV) 44b is formed over the first surface and the second surface of the lead frame 2. In addition, the second runner 44 is formed such that, when vied from upside, the width of the second portion (flow CAV) 44b is larger than that of each of the first portion 44a and the third portion 44c. Accordingly, the lead frame 2 is mounted such that the first supporting portion 34 supports, of the respective portions that form the second runner 44, the second portion (flow CAV) 44b.

Subsequently, as illustrated in FIG. 21, the clamper 33 is moved down before it contacts the stopper 35. At the time, the space 36 is formed between the resin-sealing body 8 and the clamper 33, and hence the resin-sealing body 8 is in a condition of floating in the air. Subsequently, a break pin 32 is inserted down, in the direction from the side of the first surface of the lead frame 2 toward the side of the second surface thereof, from a hole formed in the lead frame 2. With the break pin 32 being inserted down, stress is applied to the boundary between the first portion 44a and the second portion (flow CAV) 44b in the second runner 44, which makes the first supporting portion 34 serve as a rotation fulcrum point while the first supporting portion 34 is being elastically deformed. Thereby, the second runner 44 is surely bent, which generates a pre-crack at the boundary between the first portion 44a and the second portion (flow CAV) 44b in the second runner 44.

Further, a middle of the second runner 56 (position where the pre-crack is generated) is broken by pushing down the first runner 28 with the break pin 32, thereby allowing the first runner 28 to be separated from the middle of the second runner 44.

(4) Residual Gate Removing Step

Further, as illustrated in FIG. 22, the cutting punch 41 is brought down from the side of the first surface of the lead frame 2 onto the second portion (flow CAV) 44b, part of the second runner 44 that remains without being separated from the resin-sealing body 8, so that the gate 29 and the part of the second runner 44 (the second portion (flow CAV) 44b and the third portion 44c) are removed from the resin-sealing body 8.

Thus, when the second runner 44 is formed by the first portion 44a, the second portion (flow CAV) 44b, and the third portion 44c, a pre-crack is generated by supporting the second portion (flow CAV) 44b with the first supporting portion 34. At the time, the stress to be applied to the second runner 44 concentrates on the boundary between the first portion 44a and the second portion (flow CAV) 44b in the second runner 44, and hence a pre-crack is likely to be generated.

Figure 23:
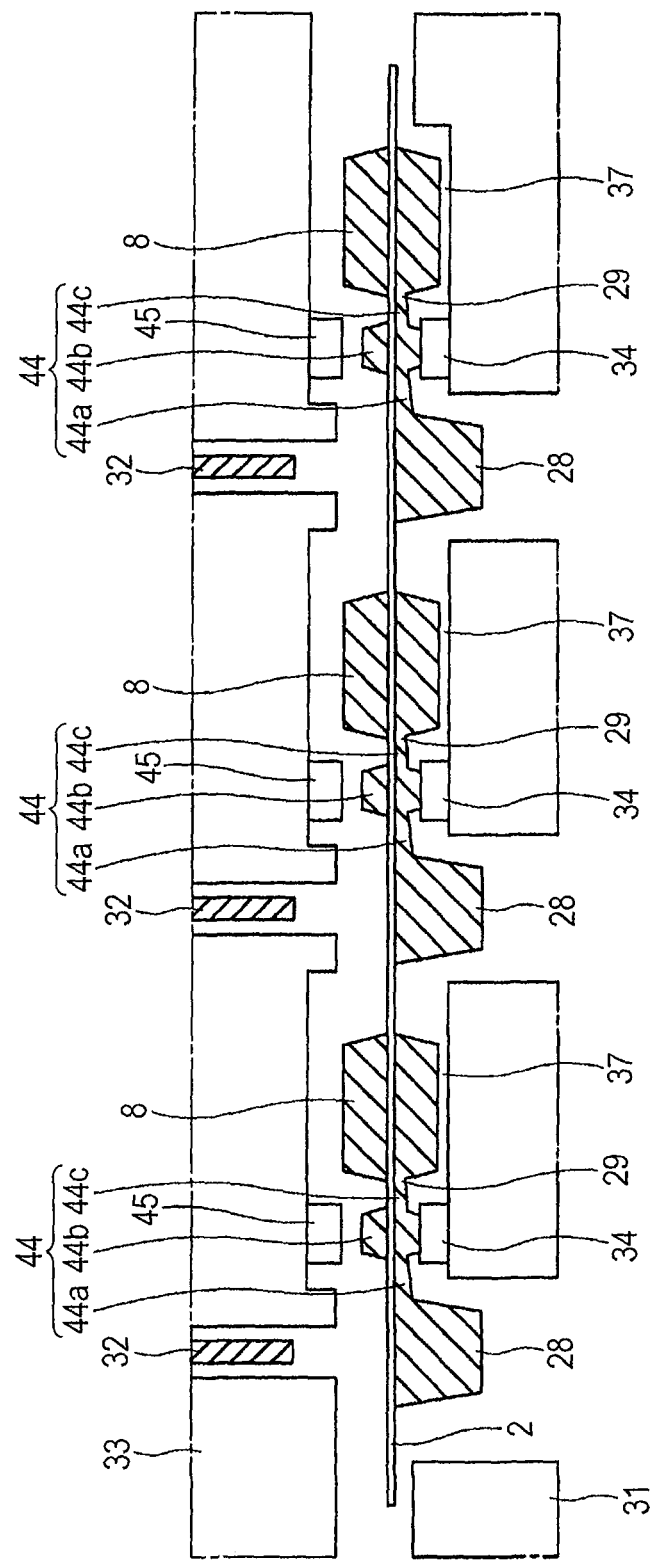
FIG. 23 is a sectional view of essential parts illustrating the gate break portion before the gate breaking, explaining a first example of the gate breaking process according to Second Embodiment of the invention.
Figure 24:
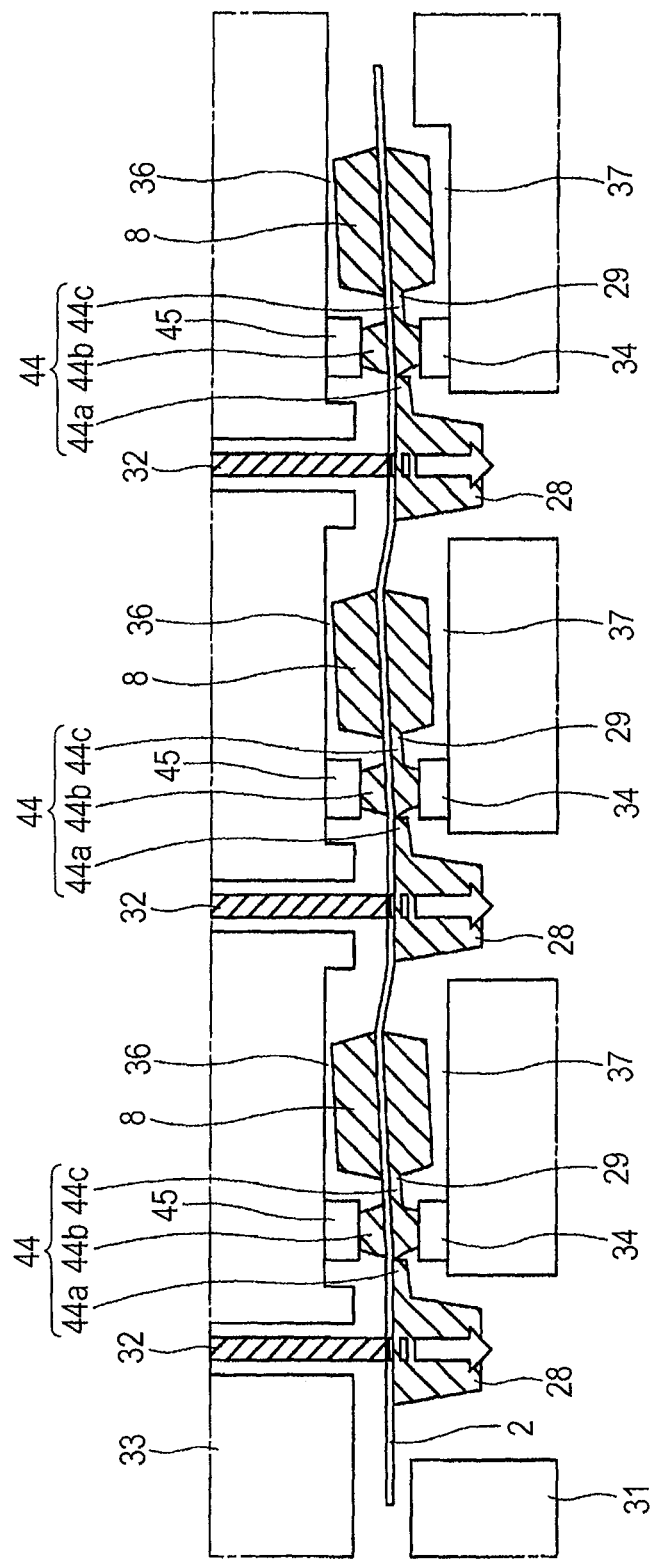
FIG. 24 is a sectional view of essential parts illustrating the gate break portion during the gate breaking, explaining the first example of the gate breaking process according to Second Embodiment of the invention.

Subsequently, a first variation of the gate breaking process will be described with reference to FIGS. 23 and 24. FIG. 23 is a sectional view of essential parts illustrating the gate break portion before the gate breaking, explaining a first example of the gate breaking process, and FIG. 24 is a sectional view of essential parts illustrating the gate break portion during the gate breaking, explaining the first example of the gate breaking process.

In the gate breaking step described with reference to the aforementioned FIGS. 19 to 21, a pre-crack is generated in the second runner 44 by supporting the second portion (flow CAV) 44b on the side of the second surface of the lead frame 2 with the first supporting portion 34 arranged over the table 31. On the other hand, in the first variation, the second portion (flow CAV) 44b on the side of the second surface of the lead frame 2 is supported by the first supporting portion 34 arranged over the table 31, and further, the second portion (flow CAV) 44b on the side of the first surface of the lead frame 2 is supported by a second supporting portion 45 arranged in the clamper 33. The first supporting portion 34 and the second supporting portion 45 are provided at positions that face each other, and the second portion (flow CAV) 44b is sandwiched by the two supporting portions 34 and 45, as illustrated in FIGS. 23 and 24.

As illustrated in the aforementioned FIG. 23, the lead frame 2 over which a sealing resin, such as the resin-sealing body 8, is formed is mounted over the table 31 in the gate break portion 13. At the time, the lead frame 2 is mounted in such a way that: the first surface of the lead frame 2 over which the semiconductor chip 1 is mounted is oriented upward; and the first supporting portion 34 arranged over the table 31 supports the second portion (flow CAV) 44b. The space 37 is formed between the resin-sealing body 8 and the table 31.

Subsequently, as illustrated in the aforementioned FIG. 24, the clamper 33 is moved down before the second supporting portion 45 arranged in the clamper 33 contacts the second portion (flow CAV) 44b on the side of the first surface of the lead frame 2. At the time, the space 36 is formed between the resin-sealing body 8 and the clamper 33, and hence the resin-sealing body 8 is in a condition of floating in the air. Subsequently, the break pin 32 is inserted down, in the direction from the side of the first surface of the lead frame 2 toward the side of the second surface thereof, from a hole formed in the lead frame 2. The moving-down operation of the clamper 33 can be controlled by sandwiching the second portion (flow CAV) 44b with the first supporting portion 34 and the second supporting portion 45, and hence the stopper 35 is not required.

Thus, by sandwiching the second portion (flow CAV) 44b with the first supporting portion 34 and the second supporting portion 45, it can be prevented that the second portion (flow CAV) 44b may rotate unnecessarily when a pre-crack is generated. Thereby, deformation of the lead frame 2, occurring around the resin-sealing body 8, can be suppressed, even when a halogen-free resin having large adhesion strength with the lead frame 2 is used.

Figure 25:
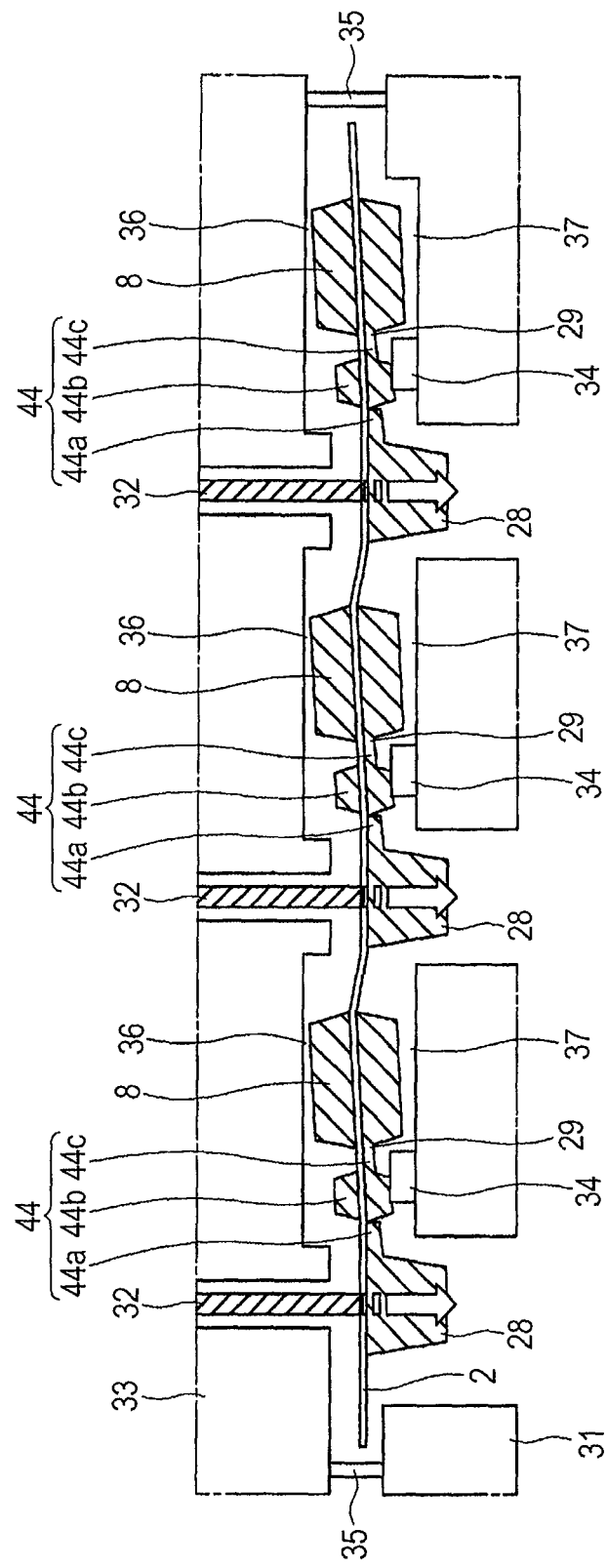
FIG. 25 is a sectional view of essential parts illustrating the gate break portion during the gate breaking, explaining a second example of the gate breaking process according to Second Embodiment of the invention.

Subsequently, a second variation of the gate breaking process will be described with reference to FIG. 25. FIG. 25 is a sectional view of essential parts illustrating the gate break portion during the gate breaking, explaining a second variation of the gate breaking process.

In the gate breaking step described with reference to the aforementioned FIGS. 19 to 21, a pre-crack is generated in the second runner 44 by supporting the whole flat surface of the second portion (flow CAV) 44b on the side of the second surface of the lead frame 2 with the first supporting portion 34. On the other hand, in the second variation, the position of the first supporting portion 34 is approached, when viewed from upside, to the resin-sealing body 8 rather to the first runner 28, and part of the flat surface of the second portion (flow CAV) 44b on the side of the second surface of the lead frame 2, the part being near to the resin-sealing body 8, is supported by the first supporting portion 34 arranged over the table 31.

Thus, by approaching, when viewed from upside, the position of the first supporting portion 34 to the resin-sealing body 8 rather to the first runner 28, the rotation of fulcrum point of the second portion (flow CAV) 44b becomes far from the resin-sealing body 8, thereby allowing the bentness of the lead frame 2 to be made large. This means is effective in the case where, for example, the thickness of the lead frame 2 is large, and accordingly the lead frame 2 is resistant to be bent, etc.

Figure 26:
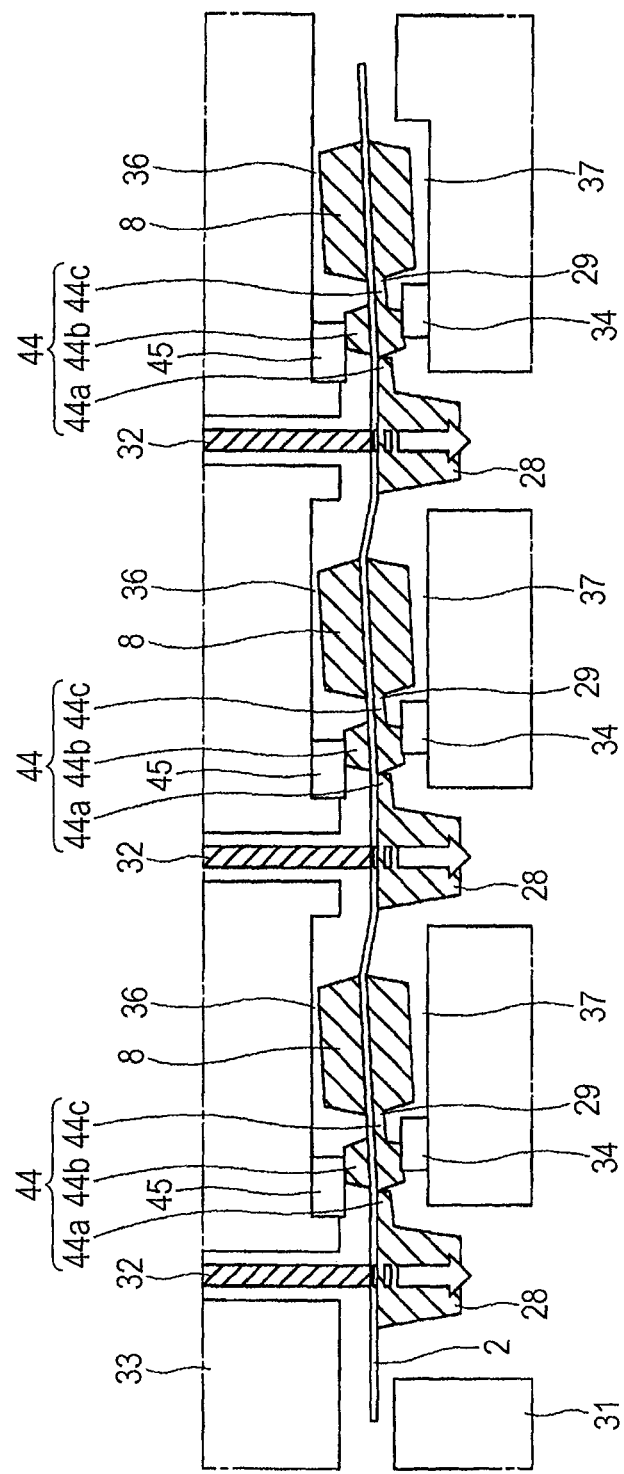
FIG. 26 is a sectional view of essential parts illustrating the gate break portion during the gate breaking, explaining a third example of the gate breaking process according to Second Embodiment of the invention.

Subsequently, a third variation of the gate breaking process will be described with reference to FIG. 26. FIG. 26 is a sectional view of essential parts illustrating the gate break portion during the gate breaking, explaining a third example of the gate breaking process.

In the gate breaking step in the aforementioned first example, the second portion (flow CAV) 44b is sandwiched by the first supporting portion 34 and the second supporting portion 45, which are provided at positions that face each other. The whole flat surface of the second portion (flow CAV) 44b on the side of the second surface of the lead frame 2 is supported by the first supporting portion 34, and the whole flat surface of the second portion (flow CAV) 44b on the side of the first surface of the lead frame 2 is supported by the second supporting portion 45, thereby allowing a pre-crack to be generated in the second runner 30.

On the other hand, in the third variation, the first supporting portion 34 and the second supporting portion 45 are not provided at positions that face each other. That is, the position of the first supporting portion 34 is approached, when viewed from upside, to the resin-sealing body 8 rather to the first runner 28, and part of the flat surface of the second portion (flow CAV) 44b on the side of the second surface of the lead frame 2, the part being near to the resin-sealing body 8, is supported by the first supporting portion 34 arranged over the table 31. Further, the position of the second supporting portion 45 is approached, when viewed from upside, to the first runner 28 rather to the resin-sealing body 8, and part of the flat surface of the second portion (flow CAV) 44b on the side of the first surface of the lead frame 2, the part being near to the first runner 28, is supported by the second supporting portion 45 arranged in the clamper 33.

Thus, by arranging the first supporting portion 34 and the second supporting portion 45 such that their positions are shifted, when viewed from upside, to each other, the rotation fulcrum point of the second portion (flow CAV) 44b becomes far from the resin-sealing body 8. Thereby, the bentness of the lead frame 2 can be made large and it can be prevented that the second portion (flow CAV) 44b may unnecessarily rotate.

Thus, according to the present Second Embodiment, by supporting the second portion (flow CAV) 44b formed in part of the second runner 44 with the first supporting portion 34 or with the first supporting portion 34 and the second supporting portion 45, a pre-crack is generated, in good reproducibility, at an almost constant position in the middle of the second runner 44 located between the resin-sealing body 8 and the first runner 28, thereby allowing the same advantages as in the aforementioned First Embodiment to be acquired.

(Third Embodiment)

In the present Third Embodiment, an example of a gate breaking process will be described, in which an excessive residual resin leading to a resin-sealing body is removed in a molding step in the processes of manufacturing a QFN (Quad Flat No-Lead Package) product. The processes of manufacturing a semiconductor device other than a molding step are approximately the same as in the aforementioned First Embodiment, and hence description thereof will be omitted herein.

Figure 27:
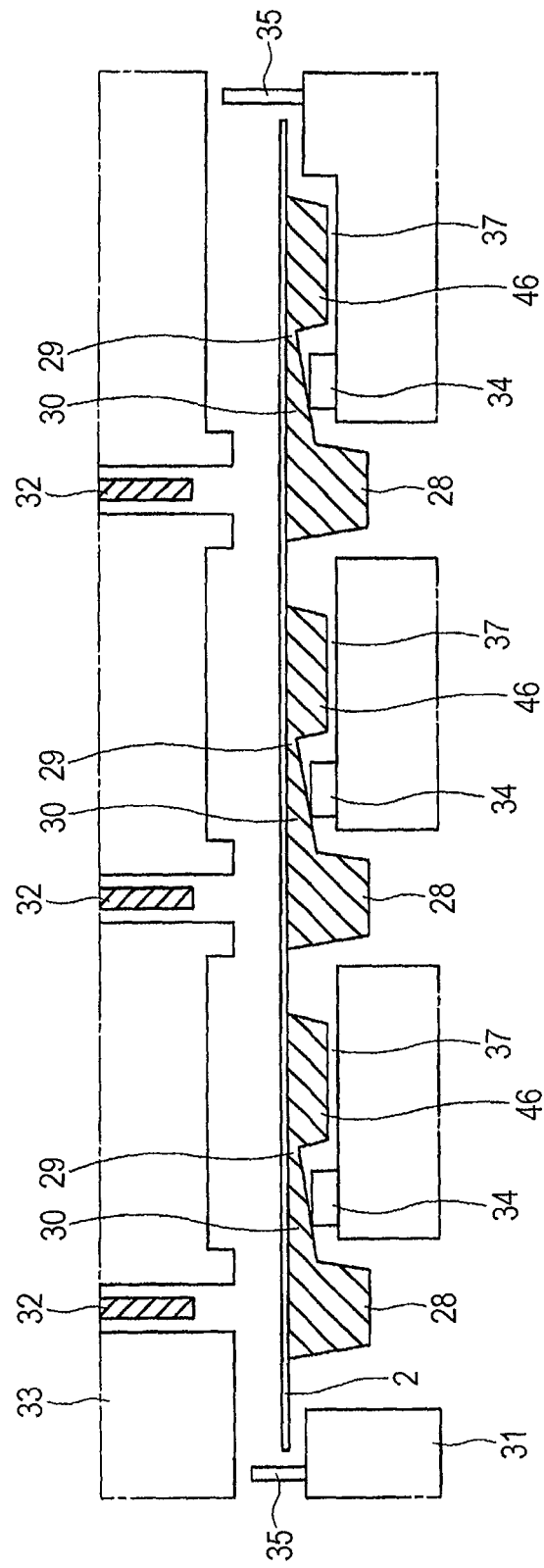
FIG. 27 is a sectional view of essential parts illustrating a gate break portion before gate breaking, explaining an example of a gate breaking process according to Third Embodiment of the invention.
Figure 28:
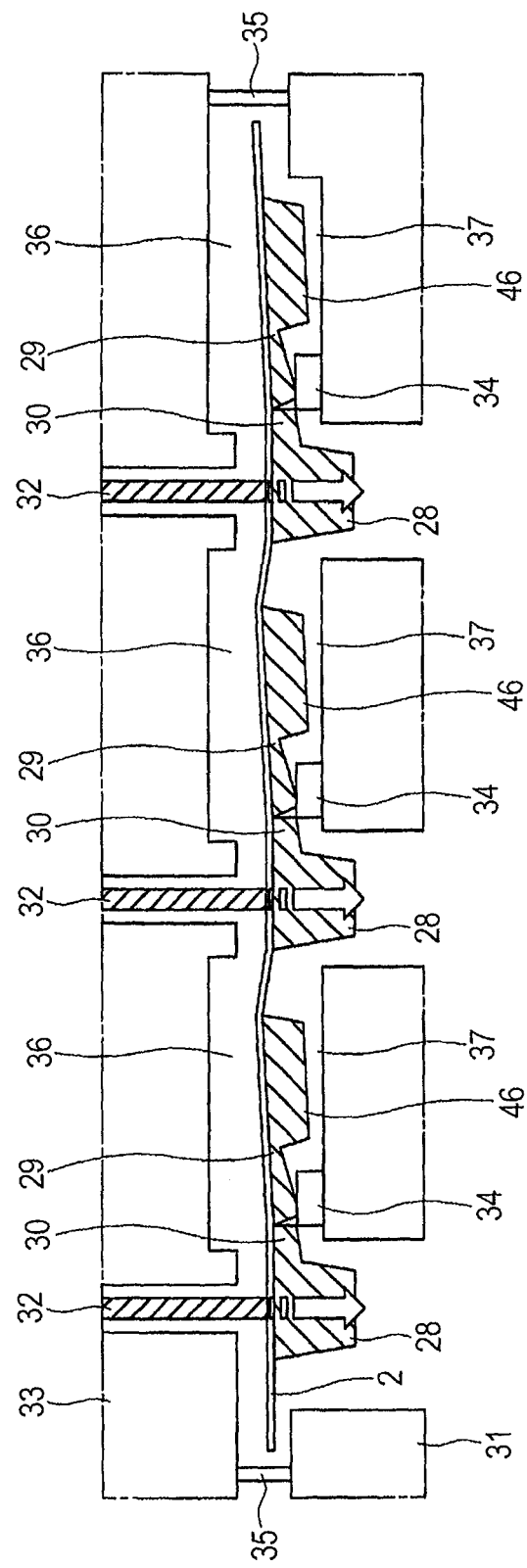
FIG. 28 is a sectional view of essential parts illustrating the gate break portion during the gate breaking, explaining an example of the gate breaking process according to Third Embodiment of the invention.

A method of manufacturing a semiconductor device according to the present Third Embodiment will be described, in the order of the steps, with reference to FIGS. 27 to 28. FIG. 27 is a sectional view of essential parts illustrating a gate break portion before gate breaking, explaining an example of a gate breaking process, and FIG. 28 is a sectional view of essential parts illustrating the gate break portion during the gate breaking, explaining an example of the gate breaking process.

<<Molding Step>>

Each semiconductor chip 1 mounted over the lead frame 2 is resin-sealed with a resin-sealing body 46 by using the molding apparatus 9 described in the aforementioned FIG. 6.

(1) Lead Frame and Tablet Supply Step

In the same way as in the aforementioned First Embodiment, the lead frame 2 and the tablet 17 are provided in the first unit U1, and further, the lead frame 2 and the tablet 17 are conveyed, by the loader 18, from the first unit U1 to the second unit U2, the third unit U3, or the fourth unit U4.

(2) Molding Step

A sealing resin is formed, by using a molding die, in the second unit U2, the third unit U3, or the fourth unit U4.

A first runner portion, a cavity portion, a gate portion, and a second runner portion, etc., are formed in the lower molding die of a molding die used herein, in the same way as in the aforementioned FIGS. 7A and 7B. In addition, the upper molding die of the molding die has a structure corresponding to that of the lower molding die; however, a cavity portion is not formed in the upper molding die, unlike in the aforementioned FIGS. 7A and 7B. This is because: the QFN has a structure in which the back surface of a die pad over which a semiconductor chip is mounted (the back surface is located opposite to the surface over which a semiconductor chip is mounted) is exposed; and a resin-sealing body is not formed over the second surface of the lead frame 2. Accordingly, the lead frame 2 is set in the molding die such that, when the upper molding die and the lower molding die of the molding die are closed together, the first surface of the lead frame 2 over which the semiconductor chip 1 is mounted is located near to the lower molding die and the second surface, opposite to the first surface, is located near to the upper molding die.

In the same way as in the aforementioned First Embodiment, a sealing resin is formed by flowing a mold resin, for example, a halogen-free resin into the space sandwiched by the upper molding die and the lower molding die of the molding die and by hardening the resin. Thereafter, the lead frame 2 over which the sealing resin is formed is conveyed, by the unloader 19, from the second unit U2, the third unit U3, or the fourth unit U4 to the fifth unit U5.

(3) Gate Breaking Step

In the gate break portion 13 in the fifth unit U5, an excessive residual resin leading to the resin-sealing body 46 is removed from the sealing resin. That is, in the aforementioned mold forming step, the first runner 28, the second runner 30, and the gate 29, which are formed with the mold resin that has flowed into the first runner portion, the second runner portion, and the gate portion in the lower molding die hardening, are respectively formed over the first surface of the lead frame 2, in addition to the resin-sealing body 46 in which the semiconductor chip 1 and part of the lead frame 2 are resin-sealed, as illustrated in FIG. 27.

As illustrated in the aforementioned FIG. 27, the lead frame 2 over which a sealing-resin, such as the resin-sealing body 46, is formed is mounted over the table 31 in the gate break portion 13. At the time, the lead frame 2 is mounted in such a way that: the first surface of the lead frame 2 over which the semiconductor chip 1 is mounted is oriented downward; and the first supporting portion 34 arranged over the table 31 supports the second runner 30. The space 37 is formed between the resin-sealing body 46 and the table 31. The thickness of the second runner 30 becomes smaller as approaching the resin-sealing body 46 from the first runner 28, but a flat portion may be provided in part of the second runner 30.

Subsequently, as illustrated in FIG. 28, the clamper 33 is moved down before the clamper 33 contacts the stopper 35. At the time, the space 36 is formed between the resin-sealing body 46 and the clamper 33, and hence the resin-sealing body 46 is in a condition of floating in the air. Subsequently, the break pin 32 is inserted down, in the direction from the side of the second surface of the lead frame 2 toward the side of the first surface thereof, from a hole formed in the lead frame 2. With the break pin 32 being inserted down, stress is applied to the portion in the second runner 30 where the second runner 30 contacts the first supporting portion 34, which makes the first supporting portion 34 serve as a rotation fulcrum point while the first supporting portion 34 is being elastically deformed. Thereby, the second runner 30 is surely bent, which generates a pre-crack at or near to the portion in the second runner 30 where the second runner 30 contacts the first supporting portion 34.

A middle of the second runner 30 (position where the pre-crack has been generated) is broken by pushing down the first runner 28 with the break pin 32, thereby allowing the first runner 28 to be separated from the middle of the second runner 30.

(4) Residual Gate Removing Step

Further, a cutting punch is brought down from the side of the second surface of the lead frame 2 onto part of the second runner 30 that remains without being separated from the resin-sealing body 46, so that the gate 29 and the part of the second runner 30 are removed from the resin-sealing body 46.

Thus, even in a QFN product, the same advantages as in the aforementioned First Embodiment can be acquired according to the present Third Embodiment.

The invention made by the present inventors has been specifically described above based on preferred embodiments; however, the invention should not be limited to the preferred embodiments, and it is needless to say that the invention may be modified variously within a range not departing from the gist thereof.

For example, a method of resin-sealing a semiconductor device in which a halogen-free resin is used has been described as the major characteristics described in the aforementioned First Embodiment to Third Embodiment, but it is needless to say that the method can be applied to mold resins other than a halogen-free resin. The aforementioned major characteristics are effective to a mold resin having large adhesion force with a metal, such as a lead frame.

The method of manufacturing a semiconductor device according to the present invention can be widely applied to methods of manufacturing semiconductor devices in which lead frames are resin-sealed by a transfer mold process.

What is claimed is:

1. A method of manufacturing a semiconductor device, comprising the steps of:
   (a) providing a wiring board having a first surface and a second surface that is opposite to the first surface;
   (b) mounting a semiconductor chip over the first surface of the wiring board;
   (c) electrically coupling an electrode pad formed over the major surface of the semiconductor chip to an external terminal in the wiring board;
   (d) sealing the semiconductor chip with a resin-sealing body; and
   (e) separating part of a runner, which leads to the resin-sealing body and is formed over one of the first surface and the second surface of the wiring board, from the resin-sealing body,
   wherein the runner is formed by a first runner and a second runner whose one side is coupled to the first runner and the other side is coupled to the resin-sealing body, and
   wherein the (e) step further includes the steps of: (e1) mounting the wiring board over a table in such a way that: the one surface over which the runner is formed is oriented downward and the other surface, opposite to the one surface, is oriented upward, and part of the second runner is supported from the one surface side by a first supporting portion; and (e2) separating the runner from a middle of the second runner by pushing down, with a break pin, the first runner in the direction from the other surface side toward the one surface side while the resin-sealing body is in a condition of floating in the air.

2. The method of manufacturing a semiconductor device according to claim 1,
   wherein the second runner has a first portion coupled to the first runner, a second portion coupled to the first portion, and a third portion coupled to the second portion and the resin-sealing body, and
   wherein the thickness of the second portion is larger than that of each of the first portion and the third portion, and the first supporting portion supports the second portion.

3. The method of manufacturing a semiconductor device according to claim 2,
   wherein the (e) step includes the step of separating the runner from a coupling portion of the second runner where the first portion and the second portion are coupled together.

4. The method of manufacturing a semiconductor device according to claim 2 further comprising the step of:
   (f) after the (e) step, separating the second portion and the third portion of the second runner from the resin-sealing body by pushing down the second portion of the second runner in the direction from the side of the other surface oriented upward toward the side of the one surface oriented downward.

5. The method of manufacturing a semiconductor device according to claim 2,
   wherein in the (e) step, the second portion of the second runner is supported from the side of the other surface oriented upward by a second supporting portion.

6. The method of manufacturing a semiconductor device according to claim 5,
   wherein when viewed from upward, the first supporting portion and the second supporting portion are arranged to be shifted from each other.

7. The method of manufacturing a semiconductor device according to claim 5,
   wherein the first supporting portion is arranged so as to be nearer to the resin-sealing body than to the second supporting portion.

8. The method of manufacturing a semiconductor device according to claim 1,
   wherein the hardness of the first supporting portion is lower than that of a molding die to be used in forming the resin-sealing body.

9. The method of manufacturing a semiconductor device according to claim 1,
   wherein the hardness of the first supporting portion is lower than that of the resin-sealing body.

10. The method of manufacturing a semiconductor device according to claim 1,
wherein the hardness of the first supporting portion is lower than 90 Shore A.

11. The method of manufacturing a semiconductor device according to claim 1,
wherein the hardness of the first supporting portion is within a range of 50 to 80 Shore A.

12. The method of manufacturing a semiconductor device according to claim 1,
wherein the first supporting portion is formed of a silicone rubber or a fluororubber.

13. The method of manufacturing a semiconductor device according to claim 1,
wherein the resin-sealing body is formed of a halogen-free resin.

14. The method of manufacturing a semiconductor device according to claim 1,
wherein the wiring board is a lead frame whose main material is copper.

15. The method of manufacturing a semiconductor device according to claim 1,
wherein in the (d) step, the resin-sealing body is formed over the first surface and the second surface of the wiring board so as to sandwich the wiring board.

16. The method of manufacturing a semiconductor device according to claim 1,
wherein the runner is not formed over the other surface.

* * * * *